United States Patent
Mori et al.

(10) Patent No.: US 11,282,937 B2
(45) Date of Patent: Mar. 22, 2022

(54) SEMICONDUCTOR DEVICE AND POWER CONVERSION DEVICE

(71) Applicant: Hitachi Power Semiconductor Device, Ltd., Hitachi (JP)

(72) Inventors: Mutsuhiro Mori, Tokyo (JP); Tomoyuki Miyoshi, Tokyo (JP); Tomoyasu Furukawa, Tokyo (JP); Masaki Shiraishi, Tokyo (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 68 days.

(21) Appl. No.: 16/976,393

(22) PCT Filed: Feb. 1, 2019

(86) PCT No.: PCT/JP2019/003572
§ 371 (c)(1),
(2) Date: Aug. 27, 2020

(87) PCT Pub. No.: WO2019/167543
PCT Pub. Date: Sep. 6, 2019

(65) Prior Publication Data
US 2021/0057537 A1    Feb. 25, 2021

(30) Foreign Application Priority Data

Feb. 28, 2018   (JP) .............................. JP2018-034628

(51) Int. Cl.
*H01L 29/47* (2006.01)
*H01L 29/78* (2006.01)
*H01L 29/868* (2006.01)

(52) U.S. Cl.
CPC .............. *H01L 29/47* (2013.01); *H01L 29/78* (2013.01); *H01L 29/868* (2013.01)

(58) Field of Classification Search
CPC ...... H01L 29/7393–7398; H01L 29/872–8725
See application file for complete search history.

(56) References Cited

U.S. PATENT DOCUMENTS

2009/0283798 A1   11/2009   Tsuzuki et al.
2011/0073905 A1    3/2011   Mori
(Continued)

FOREIGN PATENT DOCUMENTS

JP   2009-27152 A   2/2009
JP   5171776 B2   3/2013
(Continued)

OTHER PUBLICATIONS

International Search Report (PCT/ISA/210) issued in PCT Application No. PCT/JP2019/003572 dated May 21, 2019 with English translation (five pages).
(Continued)

*Primary Examiner* — Daniel P Shook
(74) *Attorney, Agent, or Firm* — Crowell & Moring LLP

(57) ABSTRACT

The invention provides an inexpensive flywheel diode having a low power loss. A semiconductor substrate side of a gate electrode provided on a surface of an anode electrode side of a semiconductor substrate including silicon is surrounded by a p layer, an n layer, and a p layer via a gate insulating film. The anode electrode is in contact with the p layer with a low resistance, and is also in contact with the n layer or the p layer, and a Schottky diode is formed between the anode electrode and the n layer or the p layer.

16 Claims, 14 Drawing Sheets

(56) References Cited

U.S. PATENT DOCUMENTS

| | | | |
|---|---|---|---|
| 2011/0254051 | A1 | 10/2011 | Tsuzuki et al. |
| 2014/0048847 | A1* | 2/2014 | Yamashita .............. H01L 29/36 257/140 |
| 2017/0040316 | A1 | 2/2017 | Soeno |
| 2017/0098700 | A1 | 4/2017 | Yamashita et al. |
| 2018/0374947 | A1 | 12/2018 | Yamashita et al. |

FOREIGN PATENT DOCUMENTS

| | | |
|---|---|---|
| JP | 2016-46377 A | 4/2016 |
| JP | 5919121 B2 | 5/2016 |
| JP | 2016-119434 A | 6/2016 |

OTHER PUBLICATIONS

Japanese-language Written Opinion (PCT/ISA/237) issued in PCT Application No. PCT/JP2019/003572 dated May 21, 2019 (four pages).

* cited by examiner

SEMICONDUCTOR DEVICE AND POWER CONVERSION DEVICE

TECHNICAL FIELD

The present invention relates to a semiconductor device suitable for controlling switching of a large current and a power conversion device using the semiconductor device.

BACKGROUND ART

At present, a power conversion device such as an inverter or a converter is widely used from home appliances such as air conditioners, refrigerators, and electromagnetic cookers, to industrial and automotive equipment such as electric vehicles, uninterruptible power supply, solar power generation, and wind power generation, and high-voltage and high-power equipment such as railway, construction machinery, steel and grid power. Such a power conversion device for energy saving or new energy is a key component in realizing a low-carbon society. Therefore, how to reduce a power loss of the power conversion device is an urgent and important problem.

Therefore, in order to reduce power loss of the power conversion device, reduction of the power loss in each circuit component constituting the power conversion device is continuously performed in related art. A main component constituting the power conversion device is a flywheel diode. As a technique that reduces the power loss in the flywheel diode, there is a technique using a Schottky diode of silicon carbide (SiC), which has a small loss (for example, see PTL 1). In addition, there is a technique using a metal oxide semiconductor (MOS) gate control diode (for example, see PTL 2).

CITATION LIST

Patent Literature

PTL 1: Japanese Patent No. 5171776
PTL 2: Japanese Patent No. 5919121

SUMMARY OF INVENTION

Technical Problem

FIG. 21 is a diagram showing an example of a circuit configuration of a general inverter 990 in the related art. The inverter 990 converts an electric energy supplied from a DC power supply Vcc into an AC power of a desired frequency using an insulated gate bipolar transistor (IGBT) 200 which is one of power semiconductors. Then, by appropriately converting the frequency, a rotation speed of a motor 950 can be controlled to a variable speed, thereby realizing energy saving.

The motor 950 is a three-phase AC motor and includes input terminals of a U-phase 910, a V-phase 911, and a W-phase 912. An input power of the U-phase 910 is supplied when a gate (G) of an IGBT 200 of an upper arm is turned on. On the other hand, as long as the gate (G) is turned off, the input power of the U-phase 910 is stopped. In this way, a power of the desired frequency can be supplied to the motor 950 by repeatedly turning on and off the gate (G).

The IGBT 200 of the upper arm refers to an IGBT 200 whose collector is connected to a positive power supply terminal 900. An IGBT 200 of a lower arm refers to an IGBT 200 whose emitter is connected to a negative power supply terminal 901.

A flywheel diode 100 is connected to the IGBT 200 in antiparallel with the IGBT 200. For example, when the IGBT 200 of the upper arm is turned off, the flywheel diode 100 commutates a current flowing through the IGBT 200 to a flywheel diode 100 in antiparallel with the IGBT 200 of the lower arm. Accordingly, an energy accumulated in a coil of the motor 950 can be released.

When the IGBT 200 of the upper arm is turned on again, the flywheel diode 100 of the lower arm becomes nonconductive and the power is supplied to the motor 950 via the IGBT 200 of the upper arm. In this way, the flywheel diode 100 becomes nonconductive and conductive repeatedly in accordance with turning on and off of the IGBT 200.

Therefore, a conduction loss in the flywheel diode 100 needs to be decreased for the sake of realizing a high efficiency, a size reduction and a cost reduction of the inverter to thereby promote the spread of the inverter. Therefore, a forward voltage drop in the flywheel diode 100 when the current flows through the flywheel diode 100 needs to be decreased. Ina power semiconductor having a rated voltage of several hundred volts or more, a pn diode made of silicon whose conductivity can be increased by being injected with electric charges is generally used to decrease the forward voltage drop.

On the other hand, when the IGBT 200 of the upper arm repeats being turned on and off, the electric charges accumulated in a forward direction in the flywheel diode 100 of the lower arm are discharged and become a backward recovery current which is superposed on a turn-on current of the IGBT 200 of the upper arm. The backward recovery current flows through a closed circuit of the DC power supply Vcc, the positive power supply terminal 900, the IGBT 200 of the upper arm, the flywheel diode 100 of the lower arm and the negative power supply terminal 901. Then, during this switching, a turn-on loss in the IGBT 200 of the upper arm is increased, and a backward recovery loss in the flywheel diode 100 of the lower arm is generated.

In this way, when the pn diode is used for the flywheel diode 100, a forward voltage can be decreased and the conduction loss can be decreased, whereas the backward recovery loss is increased. In contrast to the pn diode, there is the Schottky diode as a diode in which injection of the electric charges is low and the backward recovery current is extremely small. However, silicon has an extremely large forward voltage and increases a loss in an inverter handling a large current. Recently, the Schottky diode using silicon carbide (SiC) instead of silicon is noticed. However, in since Sic has a bad crystalline quality, a manufacturing process thereof is difficult, and an increase in diameter size thereof is inferior to silicon. Therefore, the Schottky diode of SiC has a high cost for reducing a price of the inverter and the converter, and the spread thereof is still limited.

FIG. 22 is a diagram showing an example of a conceptual circuit configuration of a low-loss flywheel diode 101 disclosed in PTL 1, which can be made entirely of silicon. In this flywheel diode 101, a pn diode made of the silicon and a Schottky diode are used by being switched by a gate ($V_{GA}$). That is, in a forward direction, a current flows through the pn diode to reduce a forward voltage drop. On the other hand, at a time of backward recovery, switching is performed such that the current flows through the Schottky diode, and a backward recovery current is decreased. Therefore, a backward recovery loss can be decreased.

However, the technique disclosed in PTL 1 discloses various examples, but does not show a suitable structure using a trench gate in which a trench is dug in silicon and a MOS gate is provided therein, which becomes a mainstream in the IGBT or the like recently.

FIG. 23 is a diagram showing an example of a cross-sectional structure of a vertical power MOSFET 500 incorporating a Schottky diode disclosed in PTL 2. Here, a Schottky diode 400 is formed between an electrode 221 and an n layer 140. The Schottky diode 400 can decrease the backward recovery current and decrease the backward recovery loss as compared with the pn diode parasitically present between a p layer 150 and the n layer 140 in the power MOSFET 500.

In addition, since the n layer 140 has a higher impurity concentration than an n⁻ layer 120, an electric field at a pn junction between the p layer 150 and the n layer 140 becomes stronger and a voltage resistance decreases, so that a p layer 130 is formed as a p-electric field progress preventing region to reduce the electric field applied to a pn junction interface. Accordingly, the voltage resistance to a backward bias is improved.

However, PTL 2 does not disclose that the pn diode is positively used to decrease the forward voltage drop. Rather, an operation of the pn diode is prevented by a Schottky junction, so as to decrease the backward recovery loss. In this structure, a bottom of a trench type gate electrode 230 is in contact with the n⁻ layer 120. Therefore, there may be a concern that a feedback capacitance C of a gate generated between the gate electrode 230 and a drain electrode 210 increases, a displacement current C·dv/dt generated at a voltage change rate (dv/dt) at the time of the backward recovery flows through the gate electrode 230, and a potential of the gate electrode 230 rises. When a gate potential rises, an n-inversion layer is formed on a side of the p layer 150 or the p layer 130 facing an oxide film 320 of the gate electrode 230, and the backward recovery current flows from the drain electrode 210 to a source electrode 220, and the backward recovery loss may increase.

An object of the invention is to provide a semiconductor device for an inexpensive flywheel diode capable of decreasing a forward voltage drop and a backward recovery current and preventing a decrease in a voltage resistance, and a power conversion device using the semiconductor device.

Solution to Problem

A semiconductor device according to the invention includes: a semiconductor substrate having a pair of surfaces; a first semiconductor layer of a first conductivity type exposed on one surface of the semiconductor substrate; a second semiconductor layer of the first conductivity type that is provided on the other surface side of the semiconductor substrate, in contact with the first semiconductor layer, and has a lower impurity concentration than that of the first semiconductor layer; a third semiconductor layer of a second conductivity type formed in the second semiconductor layer and having a higher impurity concentration than that of the second semiconductor layer; a fourth semiconductor layer of the first conductivity type formed in the third semiconductor layer; a fifth semiconductor layer of the second conductivity type formed in the fourth semiconductor layer; a cathode electrode provided on the one surface side of the semiconductor substrate and in ohmic contact with the first semiconductor layer; an anode electrode provided on the other surface of the semiconductor substrate and in contact with the fifth semiconductor layer and the fourth semiconductor layer; a gate electrode provided on the other surface of the semiconductor substrate; and a gate insulating film formed between the gate electrode and the semiconductor substrate.

Further, a surface where the gate electrode is in contact with the semiconductor substrate via the gate insulating film is surrounded by the third semiconductor layer, the fourth semiconductor layer, and the fifth semiconductor layer, a MOSFET is formed by the gate electrode, the third semiconductor layer, the fourth semiconductor layer, and the fifth semiconductor layer, and the anode electrode is in electrical contact with at least a portion of the fifth semiconductor layer at a low resistance, and includes, in a path connecting the anode electrode and the third semiconductor layer, a junction having a reverse blocking characteristic when the anode electrode is applied with a voltage with which the third semiconductor layer has a negative potential with respect to a potential of the anode electrode.

Advantageous Effect

The invention provides a semiconductor device for an inexpensive flywheel diode capable of decreasing a forward voltage drop and a backward recovery current and preventing a decrease in a voltage resistance, and a power conversion device using the semiconductor device.

BRIEF DESCRIPTION OF DRAWINGS

FIG. 13A is an example in which an anode electrode and an n layer are in an ohmic junction, and FIG. 13B is an example in which an anode electrode and an n layer are in a Schottky junction.

DESCRIPTION OF EMBODIMENTS

Figure 1:
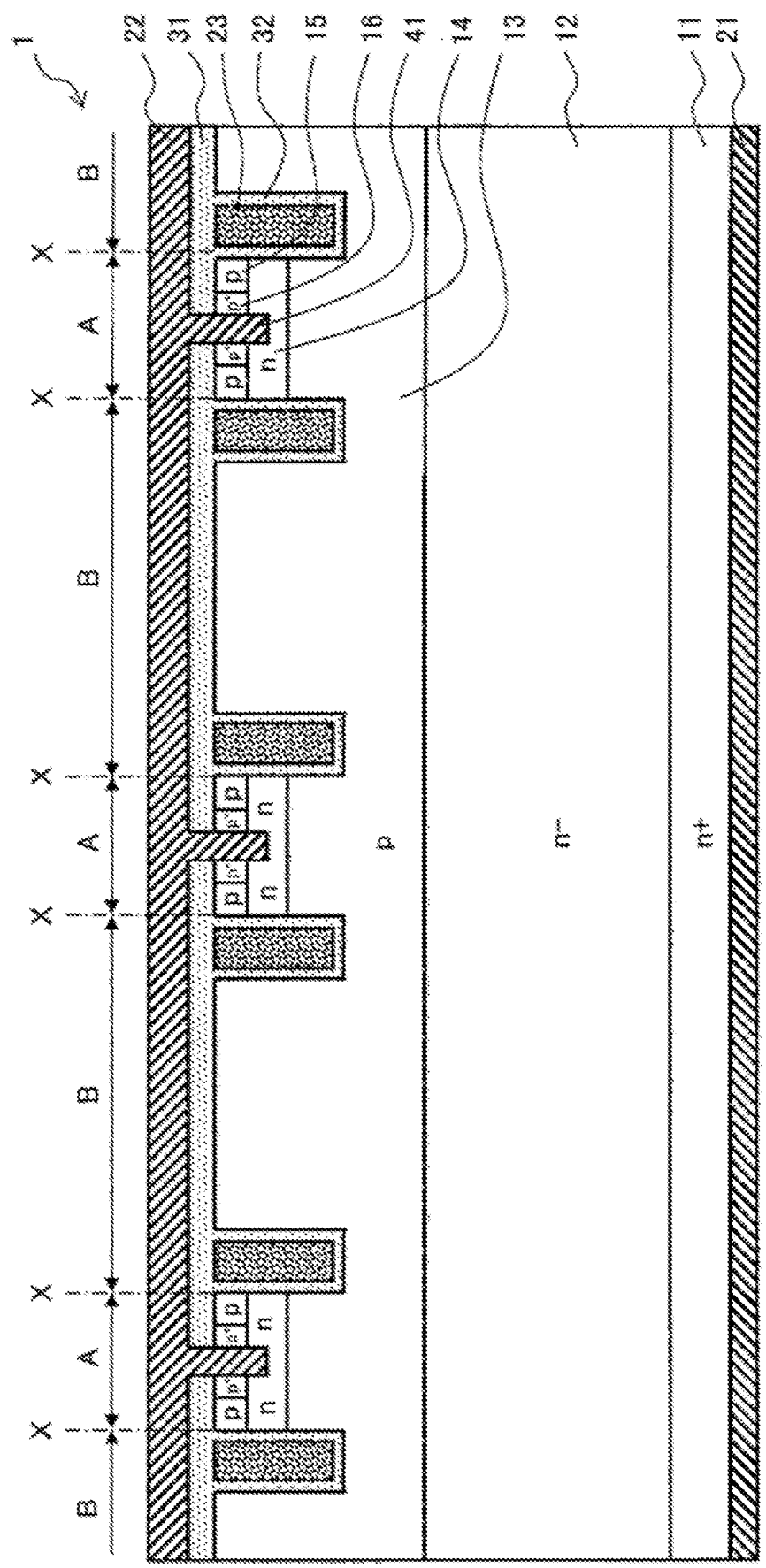
FIG. 1 is a diagram showing an example of a cross-sectional structure of a semiconductor device according to a first embodiment.

Hereinafter, embodiments of the invention will be described in detail with reference to the drawings. In these drawings, notations "n$^-$" and "n" indicate semiconductor layers of an n-type that have impurity concentrations in an ascending order. In addition, notations "p$^-$" and "p" indicate semiconductor layers of a p-type that have impurity concentrations in an ascending order of n$^-$ and n. In each drawing, common constituent elements are denoted by the same reference numerals, and a redundant description will be omitted.

First Embodiment

FIG. 1 is a diagram showing an example of a cross-sectional structure of a semiconductor device 1 according to a first embodiment of the invention. As shown in FIG. 1, a semiconductor substrate of the semiconductor device 1 includes an n$^+$ layer 11, an n$^-$ layer 12, a p layer 13, an n layer 14, a p layer 15, and a p$^+$ layer 16. A cathode electrode 21 is in electrical contact with the n$^+$ layer 11 at a low resistance. On the other hand, on a side of an anode electrode 22, the p$^+$ layer is provided in the p layer 15, and at least a part of the p$^+$ layer 16 is in contact with the anode electrode 22 at a low resistance. In addition, a Schottky junction is formed between the anode electrode 22 and the n layer 14.

A gate electrode 23 having a trench structure is insulated from the semiconductor substrate and the anode electrode 22 via a gate insulating film 32 and an insulating film 31. A side of the semiconductor substrate of the gate insulating film 32 is surrounded by the p layer 13, the n layer 14, and the p layer 15. The p$^+$ layer 16 may be in direct contact with the gate insulating film 32, but it is desirable that the p$^+$ layer 16 is formed thin and fine in a portion in contact with the anode electrode 22, as fine as possible. In addition, an operation of a parasitic pnp transistor including the p$^+$ layer 16, the n layer 14, and the p layer 15 is prevented, and a direct hole injection from the p$^+$ layer 16 to the p layer 15 is prevented. As a result, the p$^+$ layer 16 and the gate insulating film 32 are connected via the p layer 15 having a low hole injection efficiency, that is, a low impurity concentration.

Here, as shown in FIG. 1, a structure of a set of two gate electrodes 23 and the p layer 13, the n layer 14, the p layer 15, the p$^+$ layer 16 and the anode electrode 22 surrounding the set of the two gate electrodes 23 is a structure that is repeatedly arranged in a horizontal direction. At this time, a structural unit that is repeatedly arranged is often called a unit cell or a basic cell.

In such a semiconductor device 1, when a positive potential is applied to the anode electrode 22, a negative potential is applied to the cathode electrode 21, and a negative potential is applied to the gate electrode 23 with respect to the potential of the anode electrode 22, a p channel is formed on surfaces of the p layer 15, the n layer 14, and the p layer 13 on a side of the gate insulating film 32. That is, a p-channel MOSFET including the p layer 15, the n layer 14, and the p layer 13 conducts and is turned on. As a result, the p layer 13 and the n$^-$ layer 12 are forward-biased, so that a large amount of holes are injected into the n$^-$ layer 12 from the p layer 13. The injected holes promote injection of electrons from the n$^+$ layer 11, and the n$^-$ layer 12 is in a state where a large amount of holes and electrons are accumulated, and a conductivity thereof is modulated to the low resistance. Accordingly, in the semiconductor device 1, a forward voltage is decreased, and a conduction loss is decreased.

On the other hand, when a negative potential is applied to the anode electrode 22 and a positive potential is applied to the cathode electrode 21 to backwardly recover the semiconductor device 1 to a blocking state, immediately before a backward recovery, the potential of the gate electrode 23 is a potential the same potential or a positive potential with respect to the anode electrode 22, and the p-channel MOSFET is turned off. Accordingly, injection of the holes from the p layer 13 is prevented, and the accumulated electric charges of the holes or the electrons in the n$^-$ layer 12 are drastically decreased. Thereafter, when the semiconductor device 1 is backwardly recovered, a backward recovery current is decreased, and a backward recovery loss is also decreased. At this time, dv/dt is applied to the semiconductor device 1 since a potential of the cathode electrode 21 rapidly increases to a high voltage.

Figure 23:
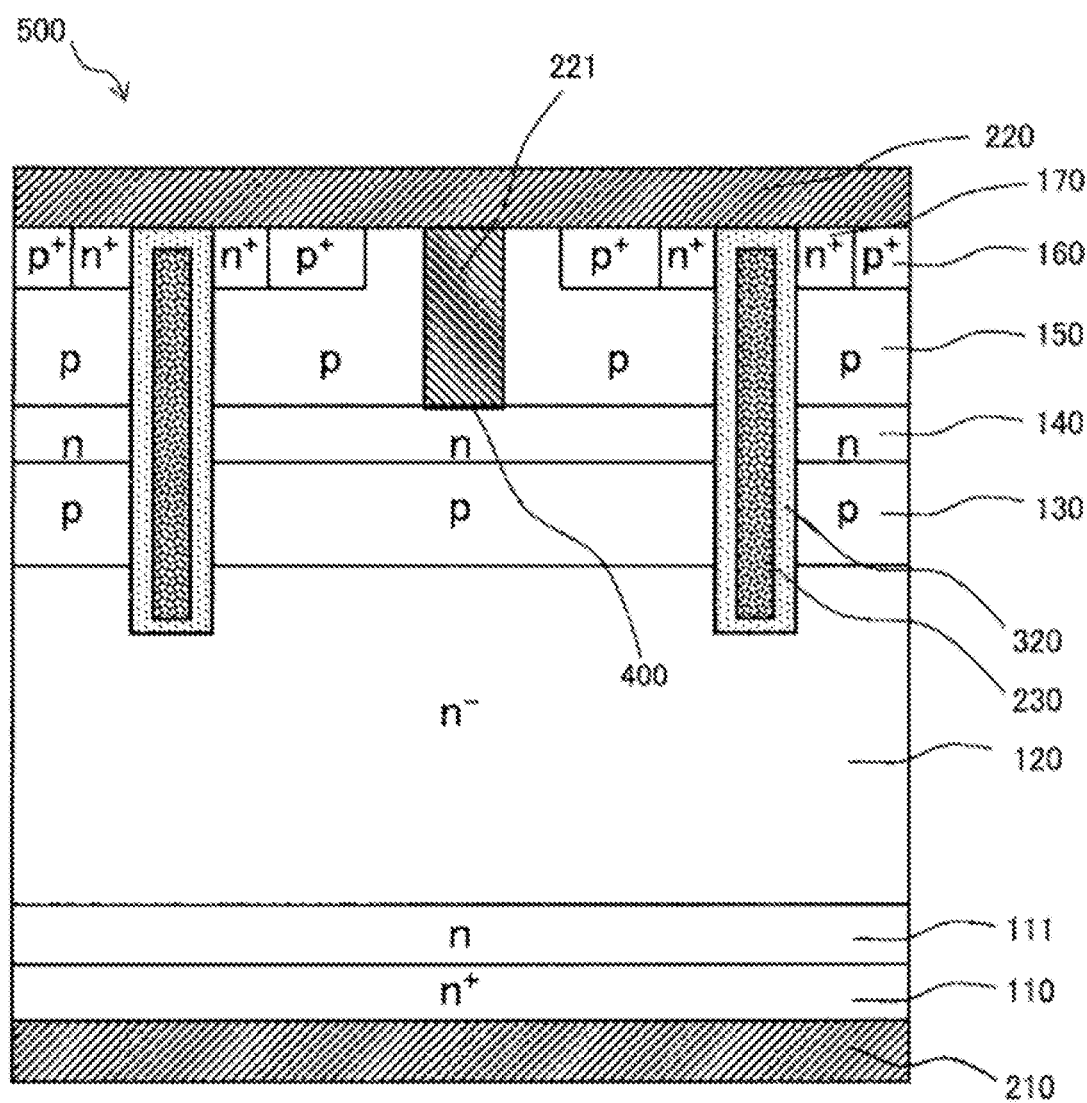
FIG. 23 is a diagram showing an example of a cross-sectional structure of a vertical power MOSFET incorporating a Schottky diode disclosed in PTL 2.

However, in the present embodiment, since the gate insulating film 32 is surrounded by the p layer 13, the n layer 14, and the p layer 15, which are substantially equal to the potential of the anode electrode 22, no displacement current due to the dv/dt flows into the gate electrode 23, and a gate potential is stable. As a result, the gate potential can be maintained at the same potential or a positive potential with respect to the potential of the anode electrode 22. In addition, since an n-channel MOSFET formed by an n layer 120, a p layer 130, and an n layer 140 as in an example of a related art shown in FIG. 23 is not generated, there is no operation of the n-channel MOSFET either, and there is no fear that the backward recovery current increases and the backward recovery loss increases.

In order to lower the forward voltage, it is necessary to increase the accumulated electric charges in the n$^-$ layer 12 or promote a conductivity modulation. As a result of an examination by inventors of the invention, it can be seen that the conductivity modulation is promoted and the forward voltage is decreased when B is made larger than A, where A is a distance between adjacent X points each including a region where the anode electrode 22 is in contact with the semiconductor substrate, and B is a distance between other adjacent X points different from A is B, where X is a contact point between the gate insulating film 32 and the p layer 15.

This is because that the electrons injected from the n+ layer 11 on a side of the cathode electrode 21 flow along a bottom of a trench gate in the region B, so that a potential of the p layer 13 is lowered and the injection of the holes from a hole accumulation layer formed in the trench gate is promoted. As a result, an injection amount of the holes increases, the conductivity of the n− layer 12 is further modulated, and the forward voltage is decreased.

At a time of the backward recovery, the holes accumulated in the n− layer 12 or the p layer 13 flow toward the anode electrode 22 at the negative potential. Therefore, the n layer 14 has an adverse effect of inhibiting a flow of the holes. When an impurity concentration of the n layer 14 is increased, a parasitic npn transistor including the n layer 14, the p layer 13, and the p− layer 12 operates, the electrons are injected from the n layer 14, and the backward recovery current increases. Further, the parasitic npn transistor may cause a secondary breakdown, and a voltage resistance may be decreased.

Therefore, in the present embodiment, an n-type Schottky junction 41 is formed between the anode electrode 22 and the n layer 14. Therefore, at the time of the backward recovery, a backward bias is applied to the n-type Schottky junction 41, the n layer 14 is depleted and the holes easily flow. In this case, in order to deplete then layer 14, it is desirable that an impurity concentration of the n layer 14 is 2E12 cm$^{-2}$ or less in terms of sheet carrier concentration. In particular, the holes easily flow into a region of the n layer 14 which is thinly sandwiched between a bottom of the anode electrode 22 and the p layer 13, and it is effective to set the sheet carrier concentration in this region to 2E12 cm$^{-2}$ or less. In addition, by decreasing the impurity concentration of the n layer 14, the parasitic npn transistor becomes difficult to operate, so that a decrease in the voltage resistance can also be prevented.

Figure 2:
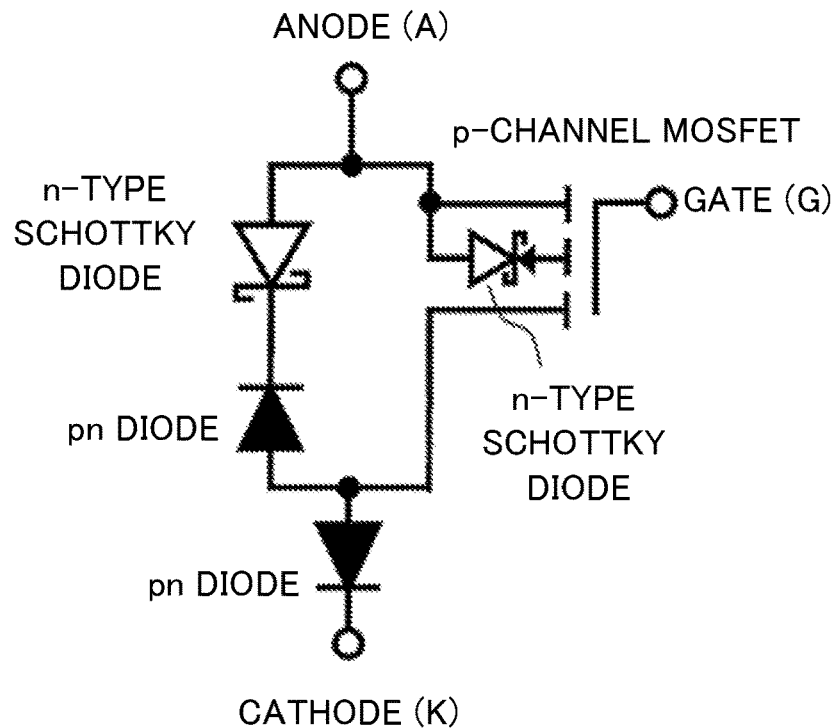
FIG. 2 is a diagram showing an example of an equivalent circuit of the semiconductor device having the cross-sectional structure of FIG. 1.

FIG. 2 is a diagram showing an example of an equivalent circuit of the semiconductor device 1 having the cross-sectional structure of FIG. 1. Here, an n-type Schottky diode and a pn diode are connected in series in reverse directions between an anode (A) and a cathode (K), and are connected in parallel with the p-channel MOSFET, and these are further connected in series with a pn diode having the n− layer 12. Since the semiconductor device 1 having such an equivalent circuit can control an anode current flowing between the anode (A) and the cathode (K) by a voltage applied to a gate (G), the semiconductor device is often referred to as a MOS control diode.

Figure 3:
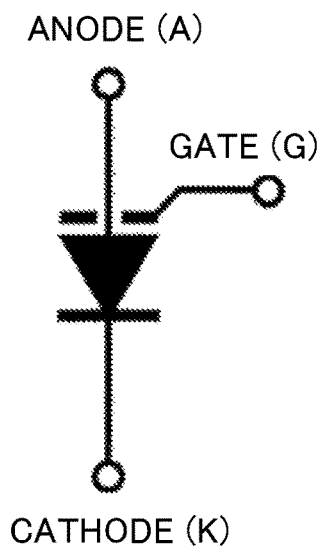
FIG. 3 shows an example of a circuit symbol of a MOS control diode having the equivalent circuit of FIG. 2.

FIG. 3 shows an example of a circuit symbol of the MOS control diode having the equivalent circuit of FIG. 2. This circuit symbol is newly created for convenience of description of the embodiment. The circuit symbol of the MOS control diode can represent, for example, the semiconductor device 1 having the cross-sectional structure shown in FIG. 1, and can also represent a semiconductor device 2 (see FIG. 10) described in second and subsequent embodiments.

Figure 4:
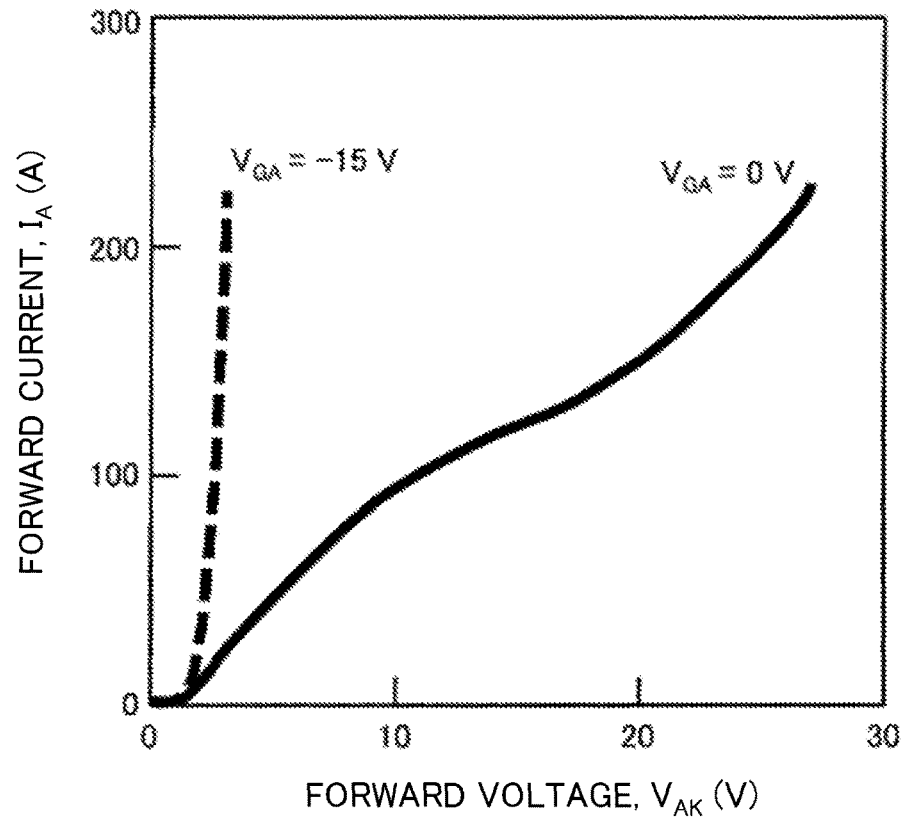
FIG. 4 is a diagram showing a gate voltage dependency of a forward characteristic of the semiconductor device according to the first embodiment.

FIG. 4 is a diagram showing a gate voltage dependency of a forward characteristic of the semiconductor device 1 according to the first embodiment. As shown in FIG. 4, when a gate voltage ($V_{GA}$) is set to −15 V, the conductivity modulation is promoted, and the forward voltage can be decreased to about 3 V at 200 A. On the other hand, when the gate voltage is set to 0 V, the p-channel MOSFET is turned off, and a high-resistance current flowing through the bottom of the anode electrode 22 other than the p-channel MOSFET becomes a mainstream. Therefore, it can be seen that the forward voltage is about 27 V, which is nearly ten times higher.

Figure 5:
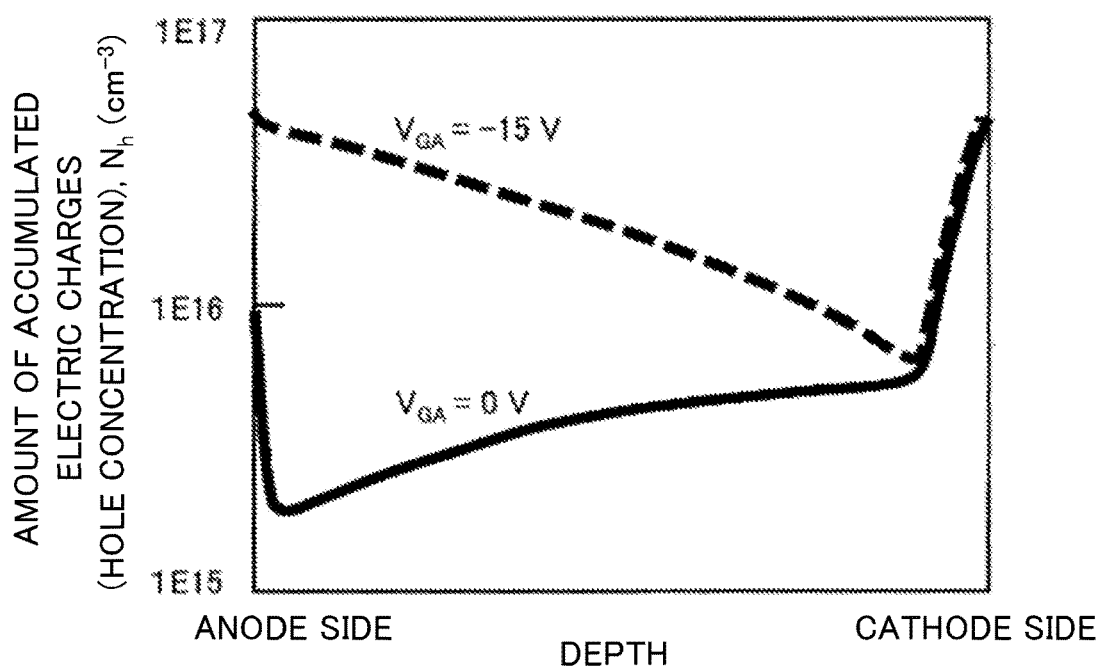
FIG. 5 is a diagram showing an example of a gate voltage dependence of an amount of accumulated electric charges inside the semiconductor device according to the first embodiment.

FIG. 5 is a diagram showing an example of a gate voltage dependence of an amount of the accumulated electric charges inside the semiconductor device 1 according to the first embodiment. The amount of the accumulated electric charges shown in FIG. 5 is a hole concentration, and is a value obtained by simulation calculation at a forward current of 200 A. It can be seen from FIG. 5 that the amount of the accumulated electric charges, particularly on an anode side, is decreased by about one digit by setting the gate voltage from −15 V to 0 V. That is, as long as the gate voltage is set to −15 V in a conductive state to lower the forward voltage, the conduction loss can be decreased. On the other hand, at the time of the backward recovery, the backward recovery current can be decreased and the backward recovery loss can be decreased by switching the gate voltage from −15 V to 0 V and decreasing the amount of the accumulated electric charges immediately before the backward recovery.

Figure 6:
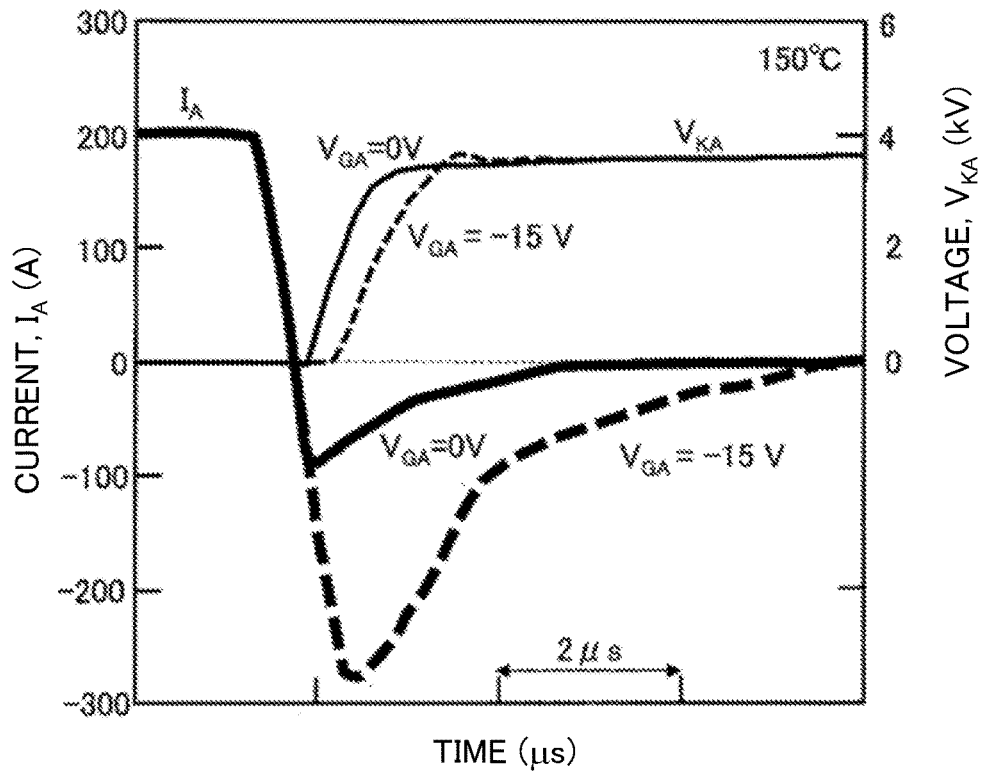
FIG. 6 is a diagram showing a gate voltage dependence of a backward recovery characteristic of the semiconductor device according to the first embodiment.

FIG. 6 is a diagram showing a gate voltage dependence of a backward recovery characteristic of the semiconductor device 1 according to the first embodiment. FIG. 6 shows a voltage $V_{KA}$ and an anode current $I_A$ between the cathode electrode 21 (K) and the anode electrode 22 (A) in a case where the gate voltage $V_{GA}$ described in FIGS. 4 and 5 is switched to 0 V at the time of the backward recovery and in a case where the gate voltage $V_{GA}$ is backwardly recovered at −15 V without switching by bold solid lines and dashed lines, respectively. It can be seen that as a result of decreasing the amount of the accumulated electric charges as shown in FIG. 5 by setting the gate voltage to 0 V, the backward recovery current is significantly decreased, and the backward recovery loss is decreased to 30%.

Figure 7:
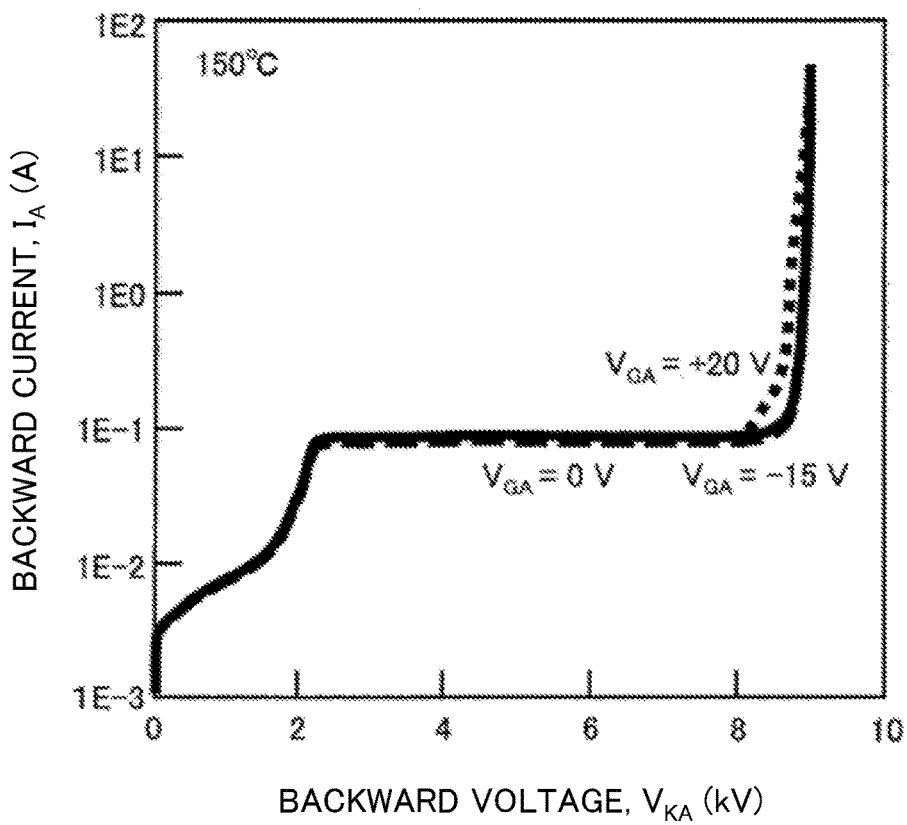
FIG. 7 is a diagram showing a gate voltage dependence of a backward characteristic of the semiconductor device according to the first embodiment.

FIG. 7 is a diagram showing a gate voltage dependence of a backward characteristic of the semiconductor device 1 according to the first embodiment. As shown in FIG. 7, the backward characteristic of the semiconductor device 1 is stable with little change even when the gate voltage is −15 V or 0 V. Further, it can be seen that even when the gate voltage is, for example, +20 V, the backward characteristic thereof is substantially the same, and a rated voltage of 6.5 kV is sufficiently blocked. This is a characteristic that cannot be realized by a vertical power MOSFET of FIG. 23 shown in PTL 2.

Figure 8:
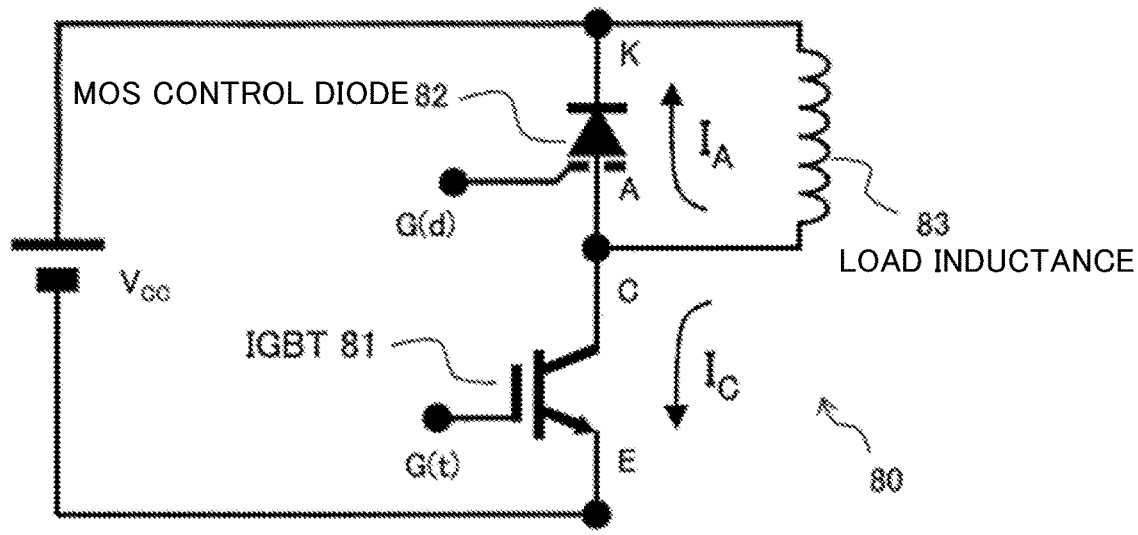
FIG. 8 is a diagram showing an example of a circuit configuration of a power conversion device to which the semiconductor device according to the first embodiment is applied.

FIG. 8 is a diagram showing an example of a circuit configuration of a power conversion device 80 to which the semiconductor device 1 according to the first embodiment is applied. Here, the semiconductor device 1 is represented as the MOS control diode having the circuit symbol shown in FIG. 3.

As shown in FIG. 8, the power conversion device 80 is configured such that a MOS control diode 82 and an IGBT 81 including the semiconductor device 1 are connected in series as an upper arm and a lower arm, respectively, and are connected to a load inductance 83 as a chopper circuit. The power conversion device 80 adjusts a current flowing through the load inductance 83 and adjusts a power output amount by turning on and off a gate G(t) of the IGBT 81.

Here, when the IGBT 81 is turned on, a current supplied from a power supply Vcc passes through the load inductance 83, and a current $I_C$ flows through the IGBT 81. Then, when the current $I_C$ reaches a desired value, the IGBT 81 is turned off. Then, the current $I_C$ flows to the MOS control diode 82 as a current $I_A$. This current $I_A$ is consumed by a loss of the MOS control diode 82 or a parasitic resistance existing in a circuit, and gradually decreases. Then, when the current $I_A$ reaches a lower limit of the desired value, the IGBT 81 is turned on again to increase a current supplied to the load inductance 83 and maintain an amount of the current within a desired range.

Figure 9:
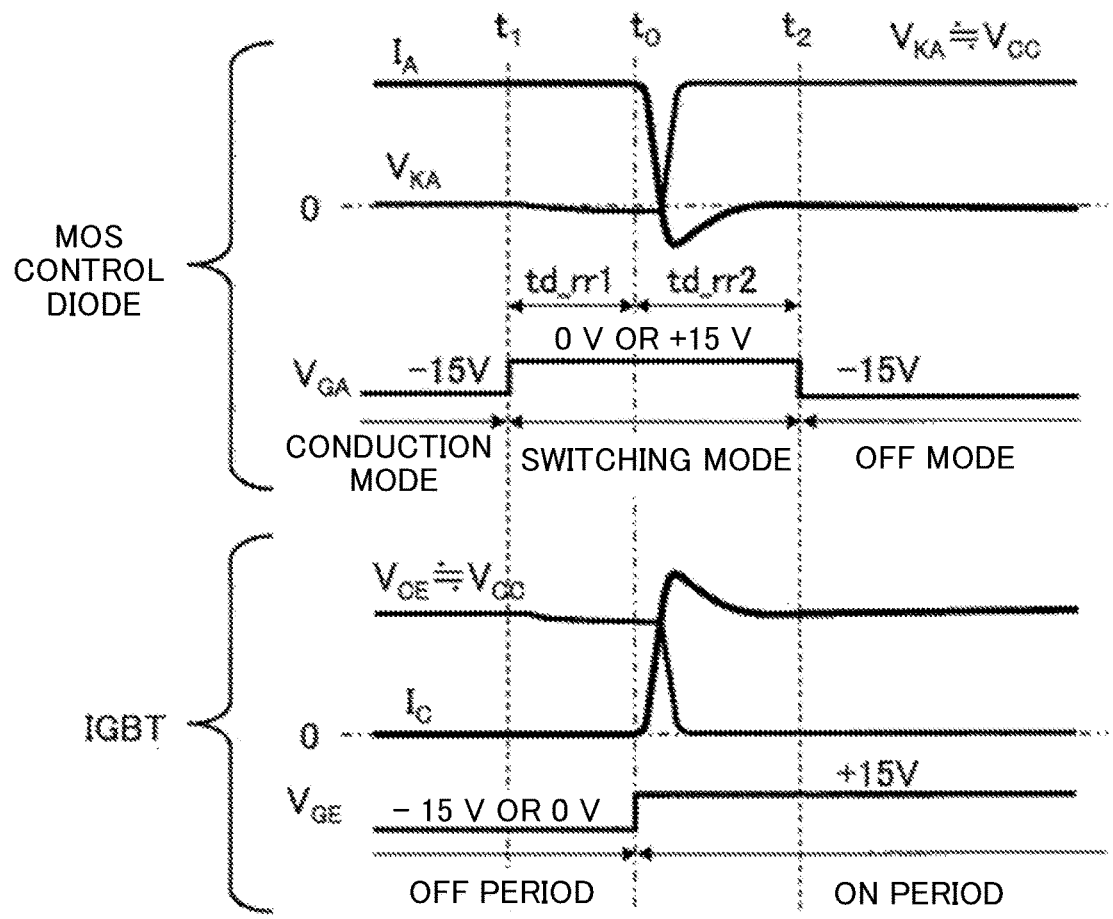
FIG. 9 is an example of operation waveforms at a time of a backward recovery of each of a MOS control diode and an IGBT of the power conversion device in FIG. 8.

FIG. 9 is an example of operation waveforms at the time of the backward recovery of each of the MOS control diode 82 and the IGBT 81 of the power conversion device 80 in FIG. 8. Here, $V_{GA}$ is a voltage applied to a gate G(d) of the MOS control diode 82, and $V_{GE}$ is a voltage applied to the gate G(t) of the IGBT 81. Here, it is assumed that the IGBT 81 of the lower arm is turned on at a time $t_0$.

In this case, the MOS control diode 82 of the upper arm switches the gate voltage $V_{GA}$ from −15 V to 0 V and decreases the accumulated electric charges inside the MOS control diode 82 at a time $t_1$ earlier than the time $t_0$ by an electric charge extraction period td_rr1. Then, in a state where the gate voltage $V_{GA}$ remains at 0 V, the IGBT 81 of the lower arm is turned on at the time $t_0$, and the MOS control diode 82 of the upper arm is backwardly recovered.

Subsequently, when the backward bias starts to be applied to the MOS control diode 82 after the time $t_0$, the gate voltage $V_{GA}$ of the MOS control diode 82 is switched from 0 V to −15 V again at an arbitrary time $t_2$. Thus, by conducting the p-channel MOSFET, the p layer 13 is fixed at the potential of the anode electrode 22, a blocking characteristic thereof is further stabilized, and the IGBT 81 of the lower arm is then turned off, and waits to cope with a case where the current is commutated to the MOS control diode 82.

A minimum value of a recovery period td_rr2 until the IGBT 81 is turned on and the voltage of the MOS control diode 82 is −15 V again can be shortened until the backward bias starts to be applied to the MOS control diode 82. By shortening this time, the holes accumulated in the n⁻ layer 12 or the p layer 13 can be smoothly discharged via the p-channel MOSFET, and the backward recovery loss can be decreased.

As described above, the MOS control diode 82 including the semiconductor device 1 according to the present embodiment has a sufficient blocking characteristic even when the gate voltage $V_{GA}$ is 0 V, and can withstand a high voltage of a backward recovery voltage. Therefore, even when the recovery period td_rr2 cannot be hardly shortened due to an accuracy of drive waveform control, it is acceptable as long as the gate voltage $V_{GA}$ can maintain 0V. Therefore, the MOS control diode 82 according to the present embodiment has a characteristic effect that the accuracy of the drive waveform control can have a likelihood.

In addition, in the invention, the gate voltage $V_{GA}$ in a switching mode period can be set to 0 V or more, for example, +15 V. This is because, as shown in FIG. 7, the invention has an ability of blocking a backward voltage at the time of the backward recovery even when the gate voltage $V_{GA}$ is +20V. By setting the gate voltage $V_{GA}$ to be positive, the n layer is formed on a surface of the semiconductor substrate 1 in contact with the gate insulating film 32, and the electrons injected from the n⁺ layer 11 and accumulated in the n⁻ layer 12 during the electric charge extraction period td_rr1 can easily flow into the anode electrode 22. As a result, there is a characteristic that the electric charges accumulated in the n⁻ layer 12 are smoothly extracted. In particular, an n-inversion layer formed on a surface of the p layer 13 in contact with the gate insulating film 32 has a large effect of collecting the electrons, leading the electrons to the n layer 14, and decreasing the accumulated electric charges in the n⁻ layer 12.

Second Embodiment

Figure 10:
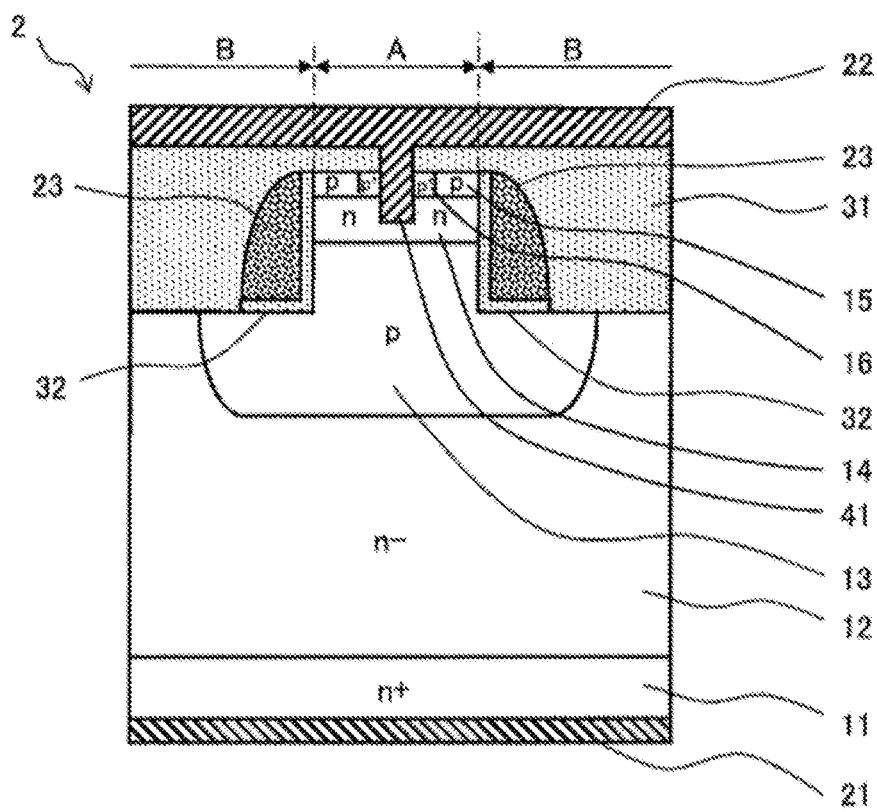
FIG. 10 is a diagram showing an example of a cross-sectional structure of a semiconductor device according to a second embodiment.

FIG. 10 is a diagram showing an example of a cross-sectional structure of the semiconductor device 2 according to a second embodiment of the invention. The semiconductor device 2 according to the second embodiment and the semiconductor device 1 according to the first embodiment are different depending on whether the gate electrode 23 is in contact with one side surface or both side surfaces of the semiconductor substrate. That is, in the semiconductor device 1 shown in FIG. 1, both side surfaces of the gate electrode 23 are in contact with the semiconductor substrate (the p layer 13, the n layer 14, and the p⁺ layer 16) via the gate insulating film 32. In contrast, in the semiconductor device 1 according to the present embodiment, one side surface of the gate electrode 23 is in contact with the semiconductor substrate (the p layer 13, the n layer 14, and the p⁺ layer 16) via the gate insulating film 32, and another side surface is in contact with a thick insulating film 31. In this way, the gate electrode 23 having the one side surface in contact with the semiconductor substrate via the gate insulating film 32 and the other side surface in contact with an insulator layer is often called a sidewall gate.

Therefore, in the present embodiment, an area where the gate electrode 23 is in contact with the semiconductor substrate via the gate insulating film 32 is about half that of the first embodiment. In addition, the present embodiment has a characteristic that the gate potential is more stable even for a larger dv/dt. As a result, a gate capacitance of the gate electrode 23 is decreased by half, thereby obtaining an effect that a driving of the gate electrode 23 is easy. Other effects are substantially the same as those of the first embodiment. For example, an effect of decreasing the forward voltage obtained in a case where the distance A<B or the like can also be obtained in the case the same as in the first embodiment.

Third Embodiment

Figure 11:
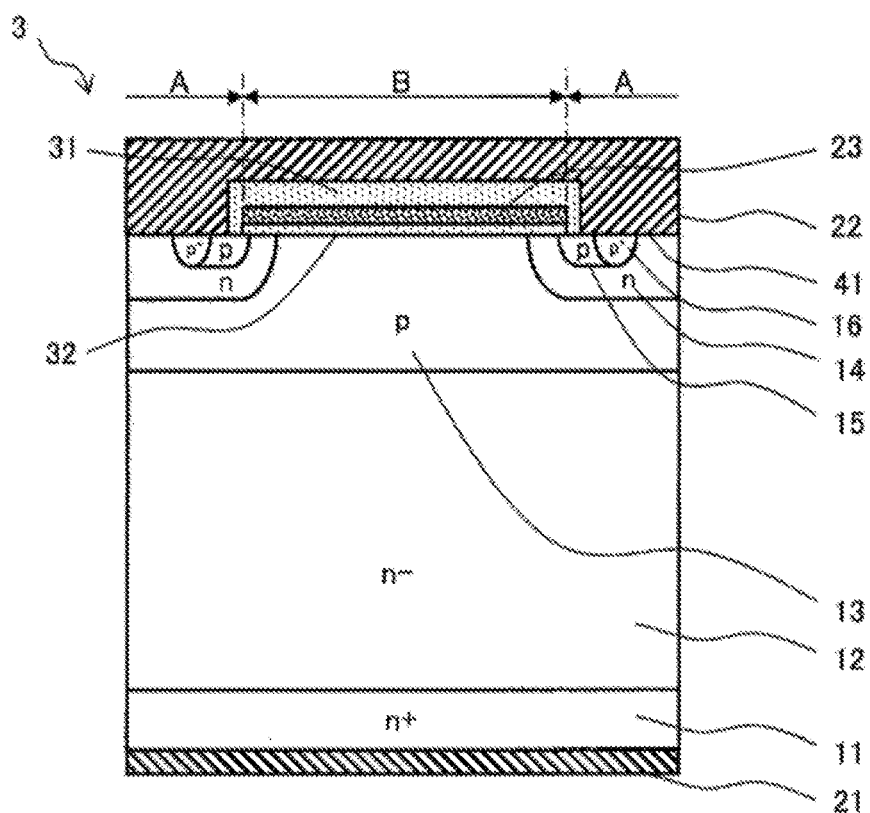
FIG. 11 is a diagram showing an example of a cross-sectional structure of a semiconductor device according to a third embodiment.

FIG. 11 is a diagram showing an example of a cross-sectional structure of a semiconductor device 3 according to a third embodiment of the invention. The semiconductor device 3 according to the third embodiment differs from the semiconductor device 1 according to the first embodiment (see FIG. 1) in that the semiconductor device 3 has a planar structure in which the gate electrode 23 is provided on the surface of the semiconductor substrate. The semiconductor device 3 having the planar structure has an effect that a manufacturing process is easy since it is not necessary to dig a trench in the semiconductor substrate. The other effects are substantially the same as those of the first embodiment.

Fourth Embodiment

Figure 12:
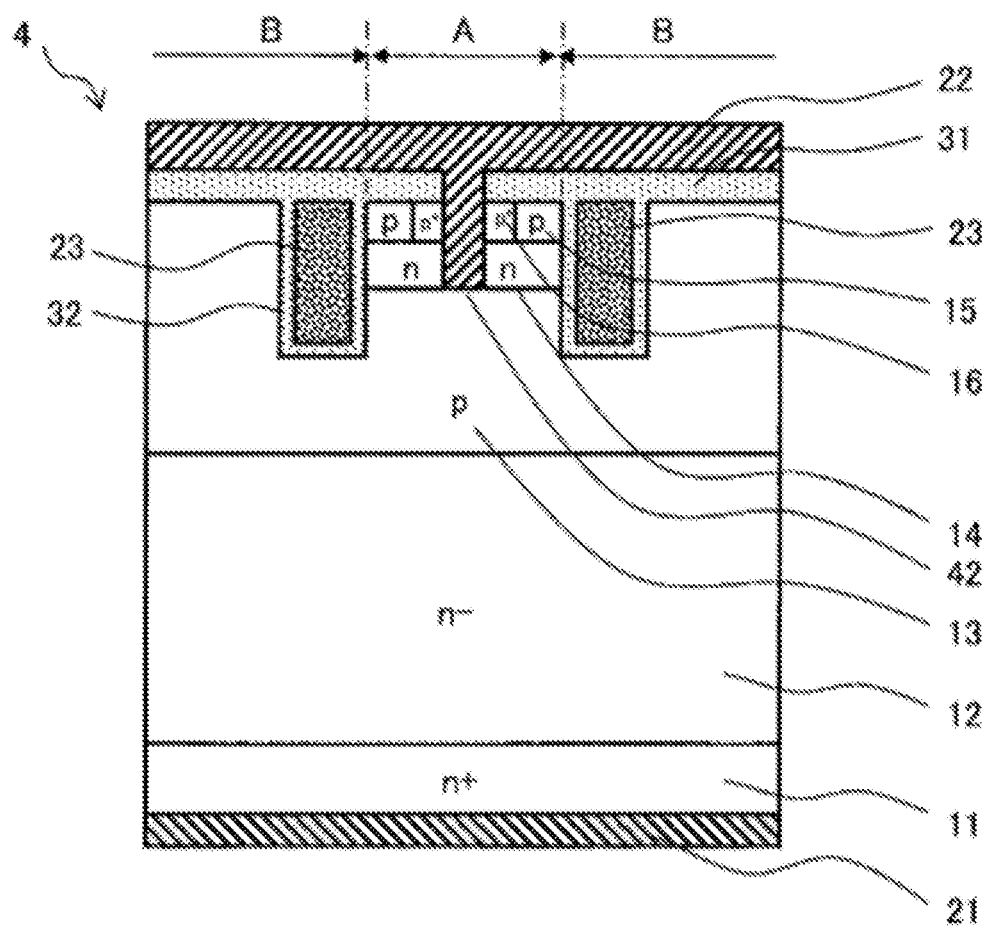
FIG. 12 is a diagram showing an example of a cross-sectional structure of a semiconductor device according to a fourth embodiment.

FIG. 12 is a diagram showing an example of a cross-sectional structure of a semiconductor device 4 according to a fourth embodiment of the invention. The semiconductor device 4 according to the fourth embodiment differs from the semiconductor device 1 according to the first embodiment in that the anode electrode 22 is in contact with not only the n layer 14 but also the p layer 13, and a p-type Schottky junction 42 is formed between the anode electrode 22 and the p layer 13. In the present embodiment, by forming the p-type Schottky junction 42, a concern that the blocking characteristics due to the parasitic npn transistor described in the first embodiment is decreased or that the n layer 14 at the bottom of the anode electrode 22 hinders a flow of the holes at the time of the backward recovery is eliminated.

On the other hand, in the forward characteristic, since the current easily flows directly from the anode electrode 22 to the p layer 13, there is also a concern that a function of controlling the amount of the accumulated electric charges of the p-channel MOSFET may be impaired. However, in the present embodiment, since the anode electrode 22 and the p layer 13 are in the p-type Schottky junction 42, there is no such concern. That is, in the present embodiment, in a forward direction, a p-type Schottky junction 45 is backward-biased, so that the flow of the current directly from the anode electrode 22 to the p layer 13 is prevented. Therefore, a current control function of the p-channel MOSFET is maintained.

In the present embodiment, a contact between the anode electrode 22 and a side wall of the n layer 14 may be the Schottky junction or an ohmic junction. However, the effect thereof is slightly different as described below.

Figure 13A:
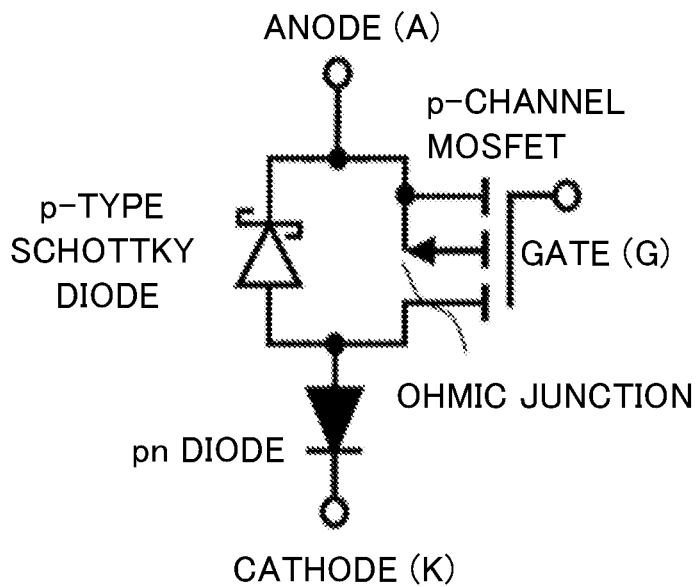
FIGS. 13A and 13B show examples of an equivalent circuit of the semiconductor device having the cross-sectional structure of FIG. 12, where
Figure 13B:
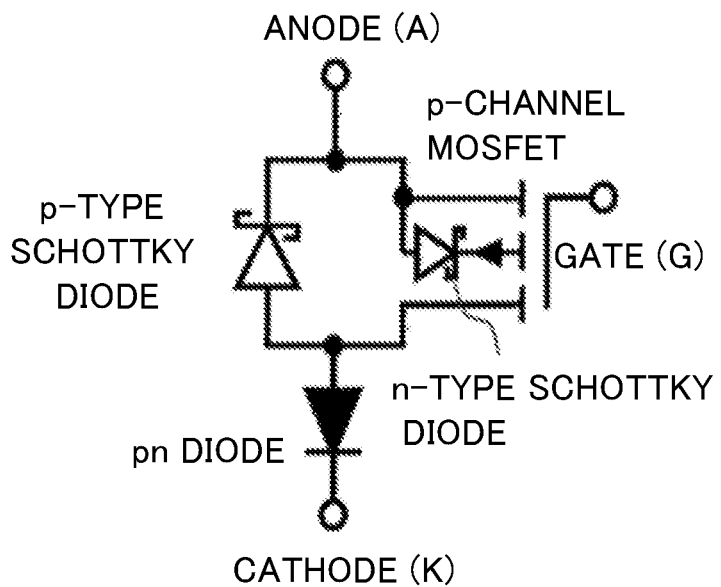

FIGS. 13(a) and 13(b) show examples of an equivalent circuit of the semiconductor device 4 having the cross-sectional structure of FIG. 12, where FIG. 13(a) is an example in which the anode electrode 22 and the n layer 14 are in the ohmic junction, and FIG. 13(b) is an example in which the anode electrode 22 and the n layer 14 are in the Schottky junction. In a case of the ohmic junction shown in FIG. 13(a), since the n layer 14 is fixed at the potential of the anode electrode 22, the potential of the n layer 14 does not float and a gate threshold voltage of the p-channel MOSFET is stabilized. On the other hand, at the time of the backward recovery, when the holes flow into the anode electrode 22 through the p layer 13 and the p-type Schottky junction 42, the p layer 13 and the n layer 14 are forward-biased, the parasitic npn transistor including the n layer 14, the p layer 13, and the n⁻ layer 12 operates, and there is a concern that the semiconductor device 4 malfunctions.

In a case of the Schottky junction shown in FIG. 13(b), since the n layer 14 and the anode electrode 22 are in the n-type Schottky junction, the backward bias occurs during the backward recovery, and the flow of the current from the anode electrode 22 to the n layer 14 is prevented. Therefore, the operation of the parasitic npn transistor is prevented, and an effect of preventing the malfunction can be expected as compared with the case of the ohmic junction of FIG. 13(a). In addition, an influence of the Schottky junction on the gate threshold voltage of the p-channel MOSFET is such that the potential of the n layer 14 is a floating potential that is increased only by a barrier height of the Schottky junction, but is fixed to the potential, so that the influence on the gate threshold voltage is small.

Fifth Embodiment

Figure 14:
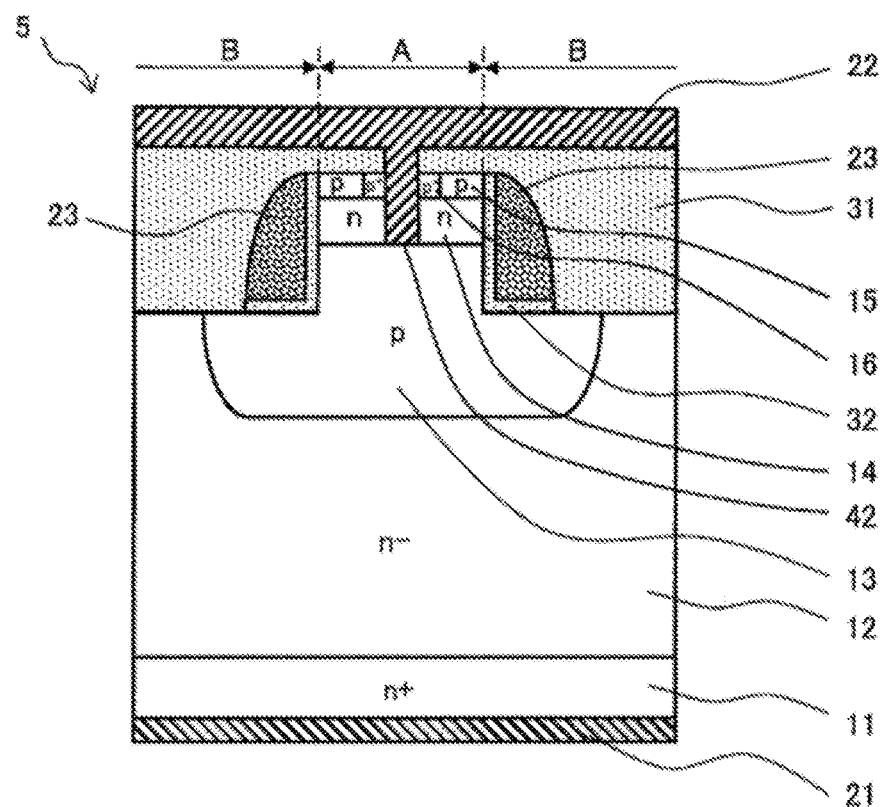
FIG. 14 is a diagram showing an example of a cross-sectional structure of a semiconductor device according to a fifth embodiment.

FIG. 14 is a diagram showing an example of a cross-sectional structure of a semiconductor device 5 according to a fifth embodiment of the invention. The semiconductor device 5 according to the fifth embodiment is different from the semiconductor device 4 according to the fourth embodiment in FIG. 12 in that the gate electrode 23 is the sidewall gate. Therefore, an effect obtained by using the sidewall gate in the present embodiment is similar to the effect described in the semiconductor device 2 according to the second embodiment in FIG. 10. In addition, other effects are similar to the effects of the semiconductor device 4 according to the fourth embodiment.

Sixth Embodiment

Figure 15:
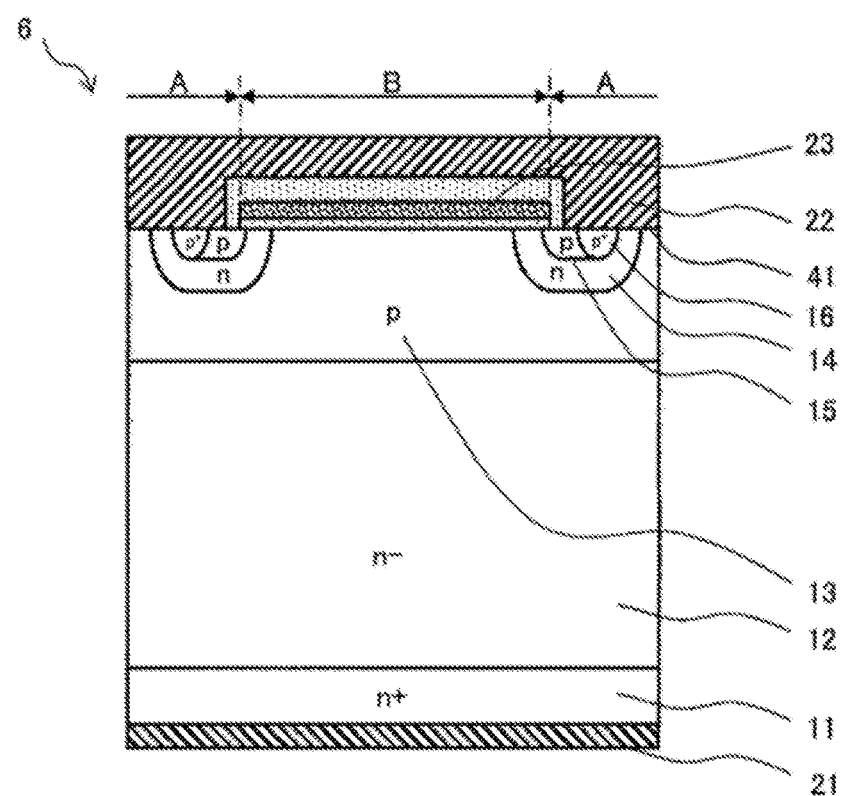
FIG. 15 is a diagram showing an example of a cross-sectional structure of a semiconductor device according to a sixth embodiment.

FIG. 15 is a diagram showing an example of a cross-sectional structure of a semiconductor device 6 according to a sixth embodiment of the invention. The semiconductor device 6 according to the sixth embodiment differs from the semiconductor device 4 according to the fourth embodiment in FIG. 12 in that the semiconductor device 6 has the planar structure in which the gate electrode 23 is provided on the surface of the semiconductor substrate. Therefore, an effect of the gate electrode 23 having the planar structure in the present embodiment is similar to the effect described in the semiconductor device 3 according to the third embodiment in FIG. 11. In addition, the other effects are similar to the effects of the semiconductor device 4 according to the fourth embodiment.

Supplement on Anode Electrode 22

Structures of the anode electrode 22 shown in FIGS. 1 and 10 and structures of the anode electrode 22 shown in FIGS. 12 and 14 are different in that depths of the trench (groove) formed in the semiconductor substrate are different. That is, in a former case, the trench for forming the anode electrode 22 remains in the n layer 14, but reaches the p layer 13 in a latter case.

Here, it is important to manufacture the anode electrode 22 of any structure in the same manufacturing process so that respective effects described above can be obtained in respective embodiments in order to enhance robustness of semiconductor device manufacturing. Therefore, it is desirable that a metal at an interface of the anode electrode 22 in contact with the n layer 14 and the p layer 13 is a Schottky metal that can be used in common. A barrier height of the common Schottky metal, which makes it easy to form the Schottky junction for both the n-type and the p-type, is about half a band gap of the semiconductor substrate, where barrier heights for the n-type and the p-type are substantially the same. That is, since a band gap of Si (silicon) is about 1.1 eV, a metal having a barrier height of about 0.55 eV is effective.

As a result of calculation by inventors of the invention, it can be seen that a desirable barrier height is 0.4 eV to 0.7 eV. As the metal having such a barrier height, titanium (Ti), tungsten (W), molybdenum (Mo), nickel (Ni), cobalt (Co), chromium (Cr) and a silicide containing anyone are suitable. In particular, Ti and a Ti silicide are widely used for a junction interface with a semiconductor in a general large-scale integrated circuit (LSI) as well, and are suitable metals that can be easily adopted to realize the embodiments of the invention.

In this case, it is preferable that Ti or the Ti silicide is formed only at an interface portion where the anode electrode 22 is in contact with the n layer 14 and the p layer 13, and most of other portions of the anode electrode 22 are formed thickly with a metal mainly configured with aluminum. Thereby, it is possible to obtain the anode electrode 22 through which a large current can flow. In addition, by using the metal having the barrier height of 0.4 eV to 0.7 eV such as Ti or the Ti silicide at the interface of the anode electrode 22, the barrier height is lower than that of aluminum (0.72 eV), such that the anode electrode 22 is easily in contact with the p⁺ layer 16 at a low resistance, and an effect of the invention is easily realized.

When Ti or the Ti silicide is used at the interface of the anode electrode 22 in contact with the n layer 14 and the p layer 13, the impurity concentrations of the n layer 14 and the p layer 13 are also important for functioning as the Schottky junction. When the impurity concentrations of the n layer 14 and the p layer 13 are high, Ti or the Ti silicide forms the ohmic junction with the n layer 14 and the p layer 13, so that the expected effect is impaired. As the result of the examination by the inventors of the invention, it can be seen that the impurity concentrations near the interface between the n layer 14 and the p layer 13 need to be 5E17 cm⁻³ or less, respectively. On the other hand, it can also be seen that the impurity concentration at the interface of the p⁺ layer 16 needs to be 1E18 cm⁻³ or more in order to bring the p⁺ layer 16 into contact with the low resistance.

Seventh Embodiment

Figure 16:
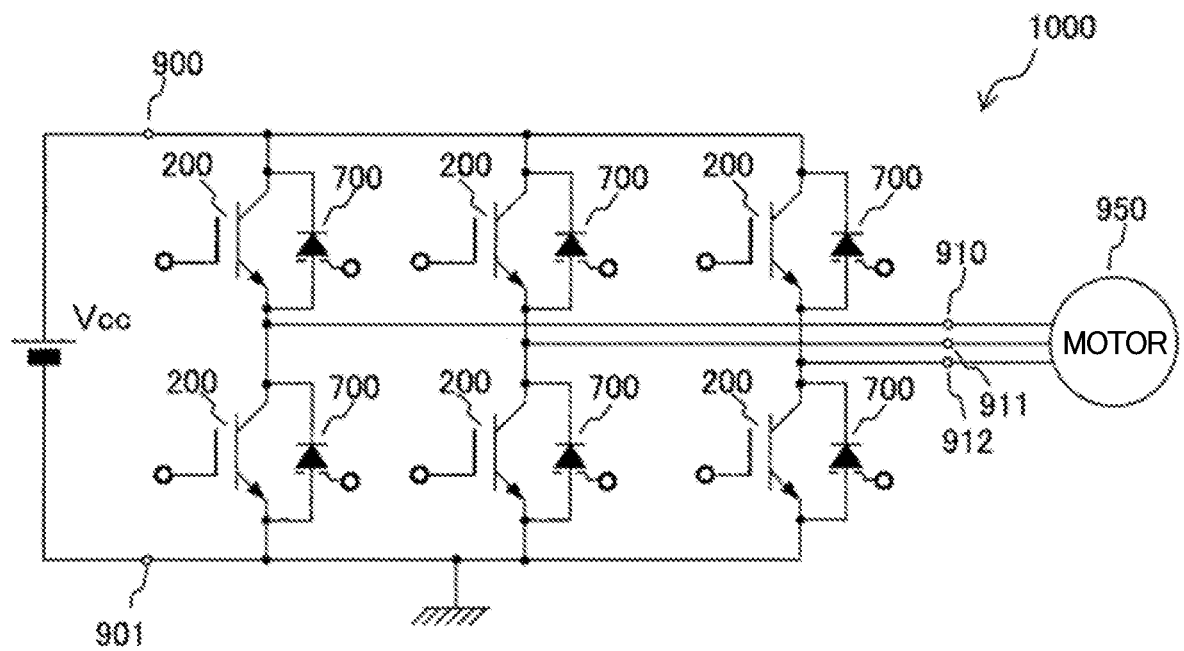
FIG. 16 is a diagram showing an example of a circuit configuration of a power conversion device according to a seventh embodiment.
Figure 21:
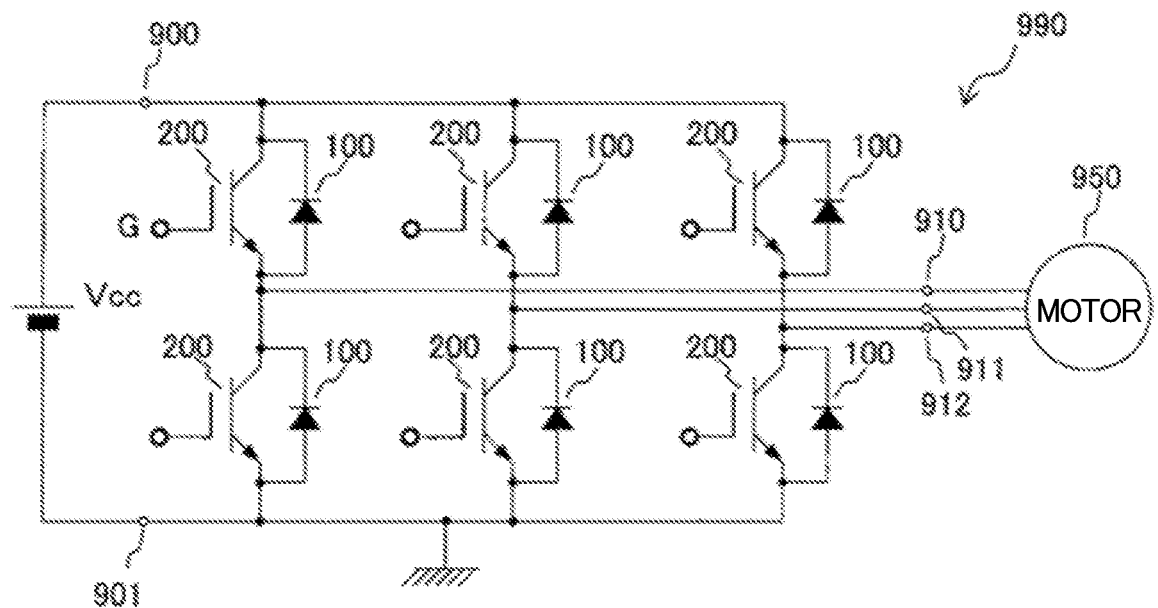
FIG. 21 is a diagram showing an example of a circuit configuration of a general inverter in a related art.
Figure 22:
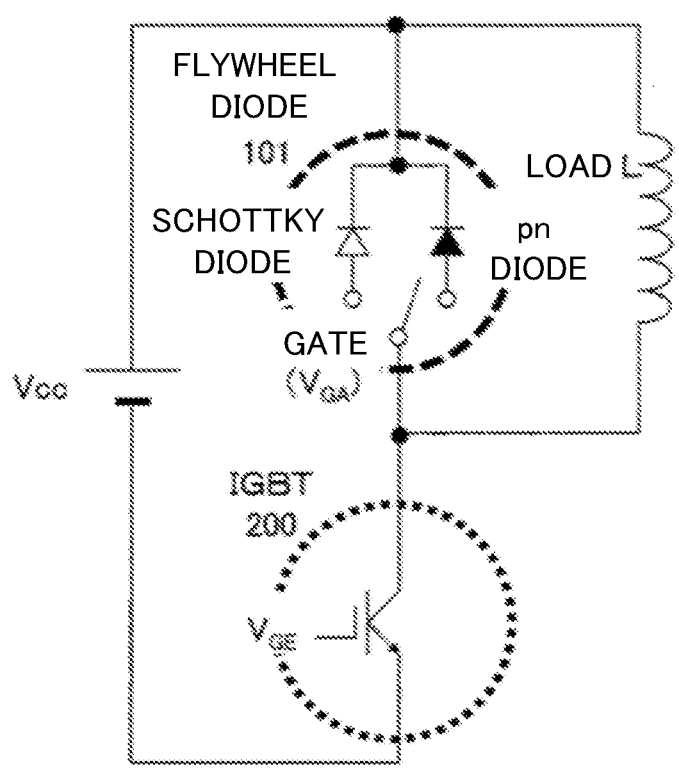
FIG. 22 is a diagram showing an example of a conceptual circuit configuration of a flywheel diode disclosed in PTL 1.

FIG. 16 is a diagram showing an example of a circuit configuration of a power conversion device 1000 according to a seventh embodiment of the invention. The power conversion device 1000 according to the present embodiment is obtained by replacing a flywheel diode 100 including the pn diode with a MOS control diode 700 in a circuit configuration of a general inverter 990 in the related art shown in FIG. 21. Here, the MOS control diode 700 may be any of the semiconductor devices 1, 2, 3, 4, 5, and 6 having structures shown in FIGS. 1, 10, 11, 12, 14, and 15. In FIG. 16, the MOS control diode 700 is represented by the circuit symbol shown in FIG. 3.

Therefore, in the power conversion device 1000, not only the conduction loss and the backward loss is decreased but also a turn-on current of the IGBT 200 due to the decreasing of the backward recovery current is decreased, as compared with the case where the pn diode is used. As a result, the turn-on loss of the IGBT 200 is also decreased, so that a low loss of the inverter, that is, a high efficiency of the power conversion device 1000 can be realized.

Eighth Embodiment

Figure 17:
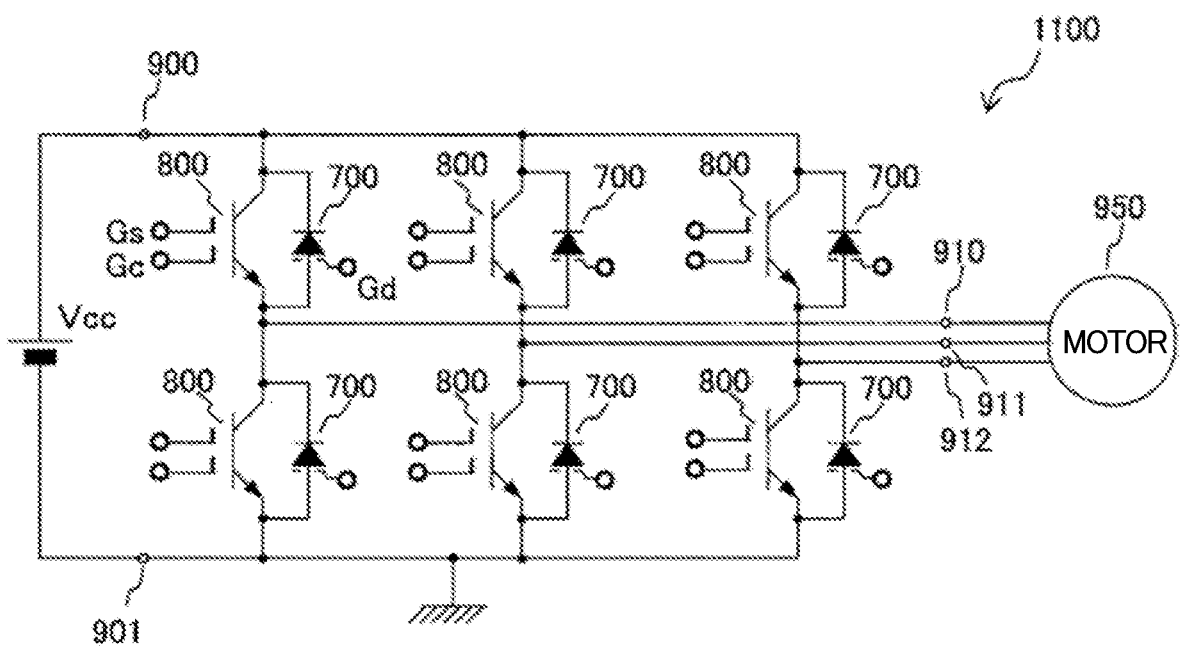
FIG. 17 is a diagram showing an example of a circuit configuration of a power conversion device according to an eighth embodiment.

FIG. 17 is a diagram showing an example of a circuit configuration of a power conversion device 1100 according to an eighth embodiment of the invention. The power conversion device 1100 according to the present embodiment is obtained by replacing the IGBT 200 with a dual gate IGBT 800 in the circuit configuration of the power conversion device 1000 according to the seventh embodiment shown in FIG. 16. Here, the dual gate IGBT 800 refers to an IGBT including two gates that can be driven with a time difference.

Figure 18:
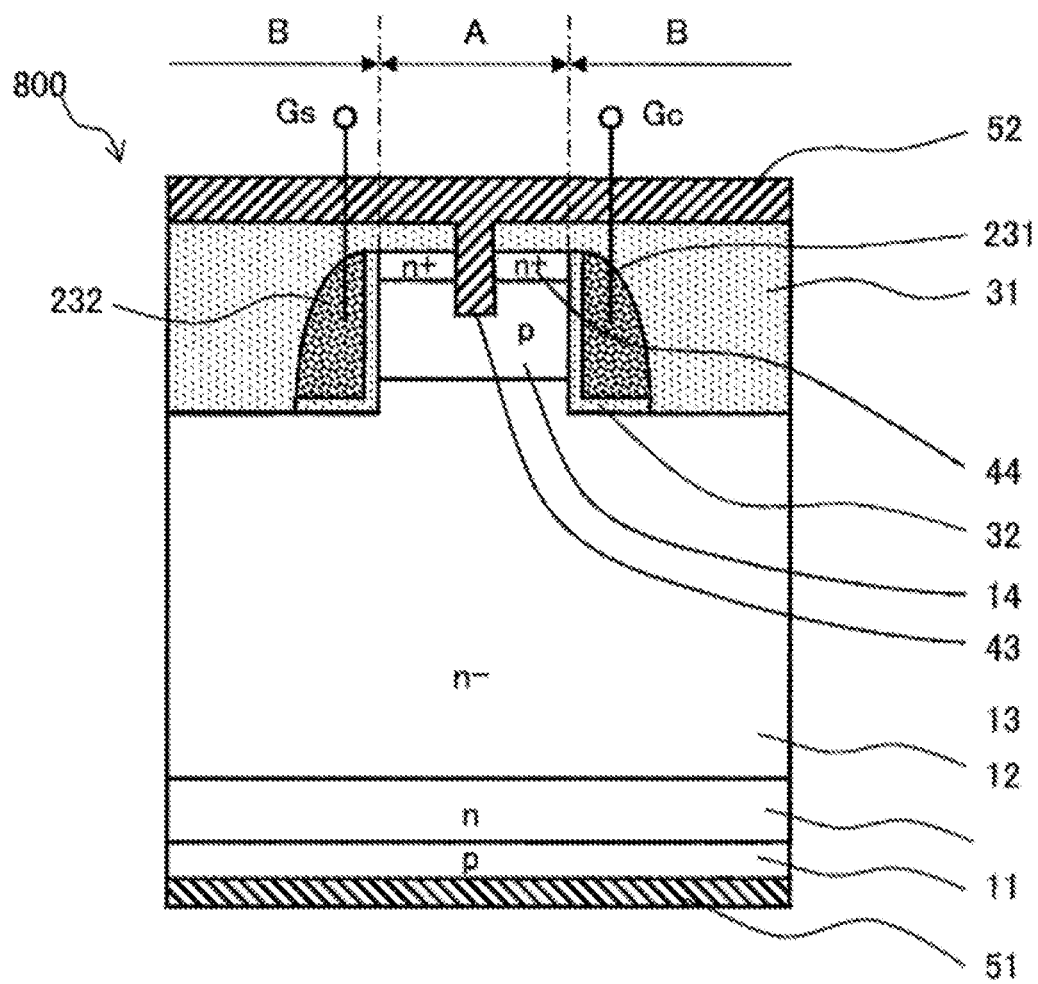
FIG. 18 is a diagram showing an example of a cross-sectional structure of a dual gate IGBT.

FIG. 18 is a diagram showing an example of a cross-sectional structure of the dual gate IGBT 800. This cross-sectional structure is based on a paper entitled "Dual side-gate HiGT breaking through limitation of IGBT loss reduction" (Miyoshi et al., May 2017) in conference proceedings of PCIM Europe 2017.

In the dual gate IGBT 800 having the cross-sectional structure of FIG. 18, by dividing gate electrodes 231 and 232 in the unit cell into two, that is, a Gc gate and a Gs gate, and driving the Gc gate and the Gs gate with the time difference, a turn-off loss or the turn-on loss can be decreased. A time difference drive timing of the Gc gate 231 and the Gs gate 232 or the like will be described separately with reference to FIG. 20.

The cross-sectional structure of the dual gate IGBT 800 shown in FIG. 18, particularly a cross-sectional structure of the gate electrodes 231 and 232, is similar to the structure of the gate electrode 23 of the semiconductor device 2 shown in FIG. 10. However, there are differences in n-type and p-type region divisions of a portion of the semiconductor substrate, and names of the electrodes formed on a front side (upper side) and a back side (lower side) of the semiconductor substrate are also different. In the dual gate IGBT 800, an emitter electrode 52 is formed on the front side (upper side), and a collector electrode 51 is formed on the back side (lower side).

Figure 19:
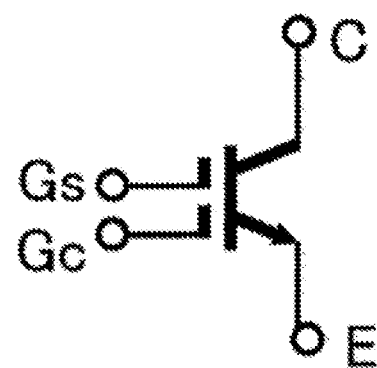
FIG. 19 is a diagram showing an example of a circuit symbol representing the dual gate IGBT of FIG. 18.

FIG. 19 is a diagram showing an example of a circuit symbol representing the dual gate IGBT 800 of FIG. 18. This circuit symbol is newly created for the convenience of the description of the present embodiment. A cross-sectional structure of the dual gate IGBT 800 indicated by the circuit symbol in FIG. 19 is not limited to the cross-sectional structure in FIG. 18, but may have another cross-sectional structure.

Figure 20:
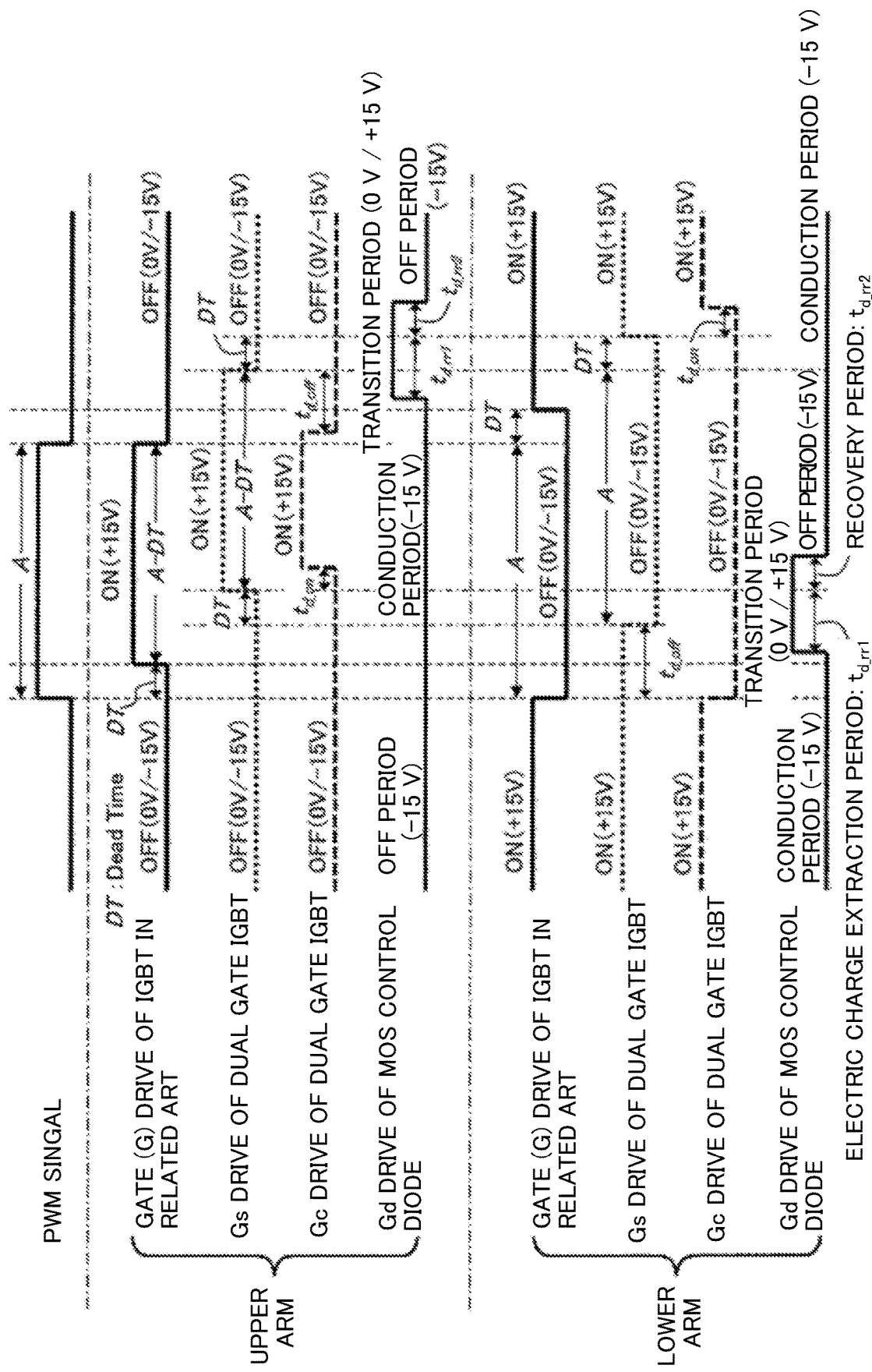
FIG. 20 is a diagram showing an example of drive waveforms of two gate electrodes (Gc gate, Gs gate) of dual gate IGBTs and gate electrodes (Gd gate) of MOS control diodes in upper and lower arms of the power conversion device.

FIG. 20 is a diagram showing an example of drive waveforms of two gate electrodes 231 and 232 (the Gc gate, the Gs gate) of dual gate IGBTs 800 and the gate electrodes 23 (Gd gates) of MOS control diodes 700 in upper and lower arms of the power conversion device 1100. These drive waveforms are generated by a control circuit based on a PWM signal of a pulse width A generated by the control circuit such as a microcomputer (not shown) while taking a dead time (DT) into consideration. FIG. 20 also shows, for reference, drive signals for gate (G) in a general IGBT in the related art.

As shown in FIG. 20, when turning off the dual gate IGBT 800, the control circuit turns off a Gc gate drive signal prior to a Gs gate drive signal by a time td_off. Accordingly, the electric charges accumulated inside the dual gate IGBT 800 can be decreased. Next, the control circuit turns off the Gs gate drive signal after a lapse of the time td_off, whereby the current of the dual gate IGBT 800 can be cut off at a high speed, and the turn-off loss of the dual gate IGBT 800 can be decreased.

On the other hand, when the dual gate IGBT 800 is turned on, the control circuit turns on the Gs gate drive signal prior to the Gc gate drive signal by a time td_on. Thereby, it is possible to control switching of the dual gate IGBT 800 and adjust the dv/dt. Next, by turning on the Gc gate drive signal, the control circuit can improve the conductivity modulation of the dual gate IGBT 800 and decrease the conduction loss.

Here, a relationship between the Gc gate drive signal and the Gs gate drive signal of the dual gate IGBT 800 and the Gd gate drive signal of the MOS control diode 700 is as follows. Here, a period since the Gd gate drive signal is switched from −15 V to 0 V, maintained at 0 V, and further switched from 0 V to −15 V is hereinafter referred to as a transition period. 0 V in this transition period can be set to a positive voltage of +15 V as described above.

Here, before the Gs gate drive signal of the dual gate IGBT 800 of an arm per se is turned on, the Gd gate drive signal of the MOS control diode 700 of a counterpart arm connected in series is set to 0 V or +15 V, and the control circuit turns off the Gc and Gs gate drive signals of the dual gate IGBT 800 connected in parallel to the MOS control diode 700. Accordingly, the pulse width A of the PWM signal can be reproduced. That is, the control circuit can generate the Gd gate drive signal, the Gs gate drive signal, and the Gc gate drive signal from the PWM signal similar to that in the related art without contradiction. Even when a circuit of the upper arm and a circuit of the lower arm each have three circuits, there is no difference in an ability to generate the Gd gate drive signal, the Gs gate drive signal, and the Gc gate drive signal of each circuit from the PWM signal without the contradiction.

It is needless to say that the MOS control diode 700 described above can further decrease the backward recovery current and decrease the backward recovery loss by decreasing a lifetime of minority carriers in the $n^-$ layer 12, similarly to a diode in the related art. Further, in a case of a configuration in which a first MOS control diode having a longer lifetime and a decreased forward voltage and a second MOS control diode having a shorter lifetime and a decreased backward recovery current (backward recovery loss) are connected in parallel, there is an effect that the conduction loss can also be decreased in addition.

According to this configuration, in the forward direction, gate electrodes 23 of the first MOS control diode and the second MOS control diode are both turned on, and the conduction loss can be decreased mainly by flowing the current through the first MOS control diode. In addition, at the time of the backward recovery, the gate electrode 23 of the first MOS control diode is turned off immediately before the backward recovery, a flow of a main current is transferred to the second MOS control diode, and the second MOS control diode is further turned off. Thereby, accumulated electric charges of the second MOS control diode can be decreased, and the backward recovery loss can be decreased due to the shorter lifetime of the second MOS control diode. Obtaining such a configuration and effect can also be a new effect of the invention in which the current of the diode can be controlled by a MOS gate.

Therefore, according to the configuration in which the first MOS control diode and the second MOS control diode are connected in parallel as described above, it is possible to realize a composite MOS control diode that simultaneously utilizes the low conduction loss of the first MOS control diode and the low backward recovery loss of the second MOS control diode.

In addition, the MOS control diode 700 and the dual gate IGBT 800 as described above can be integrated in one semiconductor chip. By integrating the MOS control diode 700 and the dual gate IGBT 800 in one semiconductor substrate, a mounting area of the MOS control diode 700 and the dual gate IGBT 800 as a whole can be decreased, so that a size reduction of power conversion circuits 1000 and 1100 can be realized.

In particular, the semiconductor devices 2 and 5 (the MOS control diode 700) shown in FIG. 10 or 14 and the dual gate IGBT 800 shown in FIG. 17 all have the same side gates, so that it is easy to integrate as the one semiconductor chip. Of course, even with a single-gate IGBT in the related art, the MOS control diode 700 of the invention can be integrated in the same semiconductor chip.

The dual gate IGBT 800 and the MOS control diode 700 as described above can be easily manufactured by a semiconductor manufacturing process using silicon. Then, by the driving shown in FIG. 20, the power conversion device 1100 such as the inverter can be operated with the high efficiency, in a safe and low loss manner. As a result, it is possible to achieve the high efficiency of a power consumption in the power conversion device such as the semiconductor device or an inverter device without using expensive SiC. Therefore, spread of the power conversion device can be promoted, and energy saving or new energy for a low-carbon society can be promoted.

The invention is not limited to the embodiments or examples described above, and includes various modifications. For example, the above embodiments and examples are described in detail for easy understanding of the invention, and the invention is not necessarily limited to those including all the configurations described above. In addition, a part of a configuration of one embodiment or example can be replaced with a configuration of another embodiment or example, and the configuration of the other embodiment or example can be added to the configuration of the one embodiment or example. In a part of a configuration of each embodiment or example, the configuration of the other embodiment or example can be added, removed, or replaced.

REFERENCE SIGN LIST 1, 2, 3, 4, 5, 6 semiconductor device (MOS control diode)
11 $n^+$ layer
12 $n^-$ layer
13 p layer
14 n layer
15 p layer
16 $p^+$ layer
21 cathode electrode
22 anode electrode
23 gate electrode
31 insulating film
32 gate insulating film
41 n-type Schottky junction
42, 45 p-type Schottky junction
51 collector electrode
52 emitter electrode
80 power conversion device
81 IGBT
82 MOS control diode
100, 101 flywheel diode
200 IGBT
210 drain electrode
220 source electrode
221 electrode
231 Gc gate
232 Gs gate
400 Schottky diode
500 power MOSFET
700 MOS control diode
800 dual gate IGBT
900 positive power supply terminal
901 negative power supply terminal
910 U-phase
911 V-phase
912 W-phase
950 motor
990 inverter
Vcc DC power supply

The invention claimed is:
1. A semiconductor device, comprising:
a semiconductor substrate having a pair of surfaces;
a first semiconductor layer of a first conductivity type exposed on one surface of the semiconductor substrate;
a second semiconductor layer of the first conductivity type that is provided on the other surface side of the semiconductor substrate, in contact with the first semiconductor layer, and has a lower impurity concentration than that of the first semiconductor layer;

a third semiconductor layer of a second conductivity type formed in the second semiconductor layer and having a higher impurity concentration than that of the second semiconductor layer;

a fourth semiconductor layer of the first conductivity type formed in the third semiconductor layer;

a fifth semiconductor layer of the second conductivity type formed in the fourth semiconductor layer;

a cathode electrode provided on the one surface side of the semiconductor substrate and in ohmic contact with the first semiconductor layer;

an anode electrode provided on the other surface of the semiconductor substrate and in contact with the fifth semiconductor layer and the fourth semiconductor layer;

a gate electrode provided on the other surface of the semiconductor substrate; and a gate insulating film formed between the gate electrode and the semiconductor substrate, wherein a surface where the gate electrode is in contact with the semiconductor substrate via the gate insulating film is surrounded by the third semiconductor layer, the fourth semiconductor layer, and the fifth semiconductor layer, and a MOSFET is formed by the gate electrode, the third semiconductor layer, the fourth semiconductor layer, and the fifth semiconductor layer, and the anode electrode is in electrical contact with at least a portion of the fifth semiconductor layer at a low resistance, and includes, in a path connecting the anode electrode and the third semiconductor layer, a junction having a reverse blocking characteristic when the anode electrode is applied with a voltage with which the third semiconductor layer has a negative potential with respect to a potential of the anode electrode.

2. The semiconductor device according to claim 1, wherein
the anode electrode is further in contact with the third semiconductor layer.

3. The semiconductor device according to claim 1, wherein
a junction between the anode electrode and the fourth semiconductor layer is a Schottky junction.

4. The semiconductor device according to claim 2, wherein
a junction between the anode electrode and the third semiconductor layer is a Schottky junction.

5. The semiconductor device according to claim 3, wherein
the semiconductor substrate is made of a silicon semiconductor, and the Schottky junction has a barrier height of 0.4 eV to 0.7 eV.

6. The semiconductor device according to claim 1, wherein
at least a region of the anode electrode in contact with the fourth semiconductor layer is formed of Ti or a Ti silicide.

7. The semiconductor device according to claim 2, wherein
at least a region of the anode electrode in contact with the third semiconductor layer is formed of Ti or a Ti silicide.

8. The semiconductor device according to claim 1, wherein
the impurity concentration of the third semiconductor layer and an impurity concentration of the fourth semiconductor layer are both $5\times10^{17}$ cm$^{-3}$ or less.

9. The semiconductor device according to claim 1, further comprising:
basic cells each including one or two of the gate electrodes and repeatedly arranged on the semiconductor substrate, wherein
in a case a point X is a position on the surface of the semiconductor substrate where the gate electrode is in contact with the fifth semiconductor layer via the gate insulating film, and where the anode electrode includes a region in contact with the fifth semiconductor layer between the point X and a second point X adjacent to the point X on one side, and when A is an interval between the point X and the second point X, and B is an interval between the point X and a third point X adjacent to the point X on an opposite side to the second point X, B>A is established.

10. The semiconductor device according to claim 1, wherein
the gate electrode has any structure among a planar structure provided on the other surface of the semiconductor substrate, a trench gate structure dug in the semiconductor substrate from the other surface of the semiconductor substrate, and a side gate structure provided on a side surface of the semiconductor substrate.

11. The semiconductor device according to claim 1, wherein
the MOSFET is configured to, after the MOSFET is turned off and the MOSFET becomes nonconductive from a state where the MOSFET is turned on and the anode electrode and the cathode electrode are forward-biased to be conductive, be turned on again when the anode electrode and the cathode electrode are backward-biased and a current starts flowing in a reverse direction between the anode electrode and the cathode electrode.

12. A power conversion device, comprising:
a pair of DC terminals;
a DC-AC conversion circuit configured by connecting two IGBT elements configured to turn on and off a current in series between the DC terminals; and
an AC terminal connected to a part where the two IGBT elements of the DC-AC conversion circuit are connected to each other, wherein
a MOS control diode including the semiconductor device according to claim 1 is connected in antiparallel with each of the IGBT elements.

13. The power conversion device according to claim 12, wherein
the IGBT elements are each formed on the same semiconductor substrate as that of a semiconductor device wherein the semiconductor device comprises:
a semiconductor substrate having a pair of surfaces;
a first semiconductor layer of a first conductivity type exposed on one surface of the semiconductor substrate;
a second semiconductor layer of the first conductivity type that is provided on the other surface side of the semiconductor substrate, in contact with the first semiconductor layer, and has a lower impurity concentration than that of the first semiconductor layer;
a third semiconductor layer of a second conductivity type formed in the second semiconductor layer and having a higher impurity concentration than that of the second semiconductor layer;

a fourth semiconductor layer of the first conductivity type formed in the third semiconductor layer;

a fifth semiconductor layer of the second conductivity type formed in the fourth semiconductor layer;

a cathode electrode provided on the one surface side of the semiconductor substrate and in ohmic contact with the first semiconductor layer;

an anode electrode provided on the other surface of the semiconductor substrate and in contact with the fifth semiconductor layer and the fourth semiconductor layer;

a gate electrode provided on the other surface of the semiconductor substrate; and a gate insulating film formed between the gate electrode and the semiconductor substrate, wherein a surface where the gate electrode is in contact with the semiconductor substrate via the gate insulating film is surrounded by the third semiconductor layer, the fourth semiconductor layer, and the fifth semiconductor layer, and a MOSFET is formed by the gate electrode, the third semiconductor layer, the fourth semiconductor layer, and the fifth semiconductor layer, and the anode electrode is in electrical contact with at least a portion of the fifth semiconductor layer at a low resistance, and includes, in a path connecting the anode electrode and the third semiconductor layer, a junction having a reverse blocking characteristic when the anode electrode is applied with a voltage with which the third semiconductor layer has a negative potential with respect to a potential of the anode electrode.

14. The power conversion device according to claim 12, wherein each of the IGBT elements is a dual gate IGBT including a first gate and a second gate configured to be able to perform turned on and off control independently of each other.

15. The power conversion device according to claim 14, wherein both the first gate and the second gate of each of the IGBT elements connected in parallel to the MOS control diodes are configured to be turned off during a period when the MOSFET of the semiconductor device is off.

16. The power conversion device according to claim 14, wherein the semiconductor device includes a first semiconductor device and a second semiconductor device connected in parallel to each other, a lifetime of a carrier of the second semiconductor layer of the second semiconductor device is longer than a lifetime of a carrier of the second semiconductor layer of the first semiconductor device, the MOSFETs of the first semiconductor device and the second semiconductor device are configured to be turned on and become conductive during at least one time period in a forward direction, and at a time of a backward recovery, the MOSFET of the second semiconductor device is configured to be turned off prior to the MOSFET of the first semiconductor device immediately before the backward recovery, and thereafter the MOSFET of the first semiconductor device is configured to be turned off.

* * * * *